(12) United States Patent
Hirano et al.

(10) Patent No.: US 7,221,694 B2
(45) Date of Patent: May 22, 2007

(54) SEMICONDUCTOR LASER LIGHT EMITTING APPARATUS AND SOLID-STATE LASER ROD PUMPING MODULE

(75) Inventors: Yoshihito Hirano, Tokyo (JP); Shuhei Yamamoto, Tokyo (JP); Yasuharu Koyata, Tokyo (JP); Nicolaie Pavel, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 210 days.

(21) Appl. No.: 10/751,997

(22) Filed: Jan. 7, 2004

(65) Prior Publication Data

US 2004/0136432 A1 Jul. 15, 2004

Related U.S. Application Data

(60) Division of application No. 10/425,883, filed on Apr. 30, 2003, now Pat. No. 6,738,407, which is a division of application No. 09/404,205, filed on Sep. 23, 1999, now Pat. No. 6,594,299, which is a continuation-in-part of application No. 09/250,408, filed on Feb. 16, 1999, now abandoned.

(30) Foreign Application Priority Data

| Nov. 12, 1998 | (JP) | ................................ 10-322512 |
| Feb. 24, 1999 | (JP) | ................................ 11-47083 |
| May 10, 1999 | (JP) | ................................ 11-129183 |

(51) Int. Cl.
  *H01S 3/094* (2006.01)
  *H01S 5/00* (2006.01)

(52) U.S. Cl. ..................................... 372/75; 372/50.12

(58) Field of Classification Search .................. 372/75, 372/69, 70, 72, 50.12
See application file for complete search history.

(56) References Cited

U.S. PATENT DOCUMENTS

| 5,033,058 A | 7/1991 | Cabaret et al. |
| 5,086,433 A | 2/1992 | Pocholle et al. |
| 5,287,371 A | 2/1994 | Bournes |
| 5,307,365 A | 4/1994 | Stappaerts et al. |
| 5,661,738 A | 8/1997 | Yasui et al. |

(Continued)

OTHER PUBLICATIONS

H. Brusselbach et al., Technical Digest of Advanced Solid State Lasers, 1997, pp. 285-287.

(Continued)

*Primary Examiner*—James Menefee

(57) ABSTRACT

A solid-state laser rod pumping module has a stack-type semiconductor laser including a plurality of bar-shaped components that are stacked in a direction parallel to the axis of a solid-state laser rod. Each bar-shaped component includes a plurality of laser-light-emitting portions that are aligned and integrated in a direction orthogonal to the axis of the solid-state laser rod. The large divergence angle of the stack-type semiconductor can be compensated by including a light focusing component for focusing laser light emitted out of the stack-type semiconductor laser. The focused light is guided by a laser light guiding component disposed in a diffusive reflection tube. A light guiding component guides the focused light onto a solid-state laser rod located within the diffusive reflective tube, while maintaining the length of one side of the cross section of the guided light.

25 Claims, 16 Drawing Sheets

U.S. PATENT DOCUMENTS 5,883,737 A    3/1999  Fujikawa et al.
5,900,981 A *  5/1999  Oren et al. .................. 359/619
6,282,217 B1   8/2001  Takase
6,594,299 B1   7/2003  Hirano et al.

OTHER PUBLICATIONS

S. Fujikawa et al., Technical Digest of Advanced Solid State Lasers, 1997, pp. 296-299.

* cited by examiner

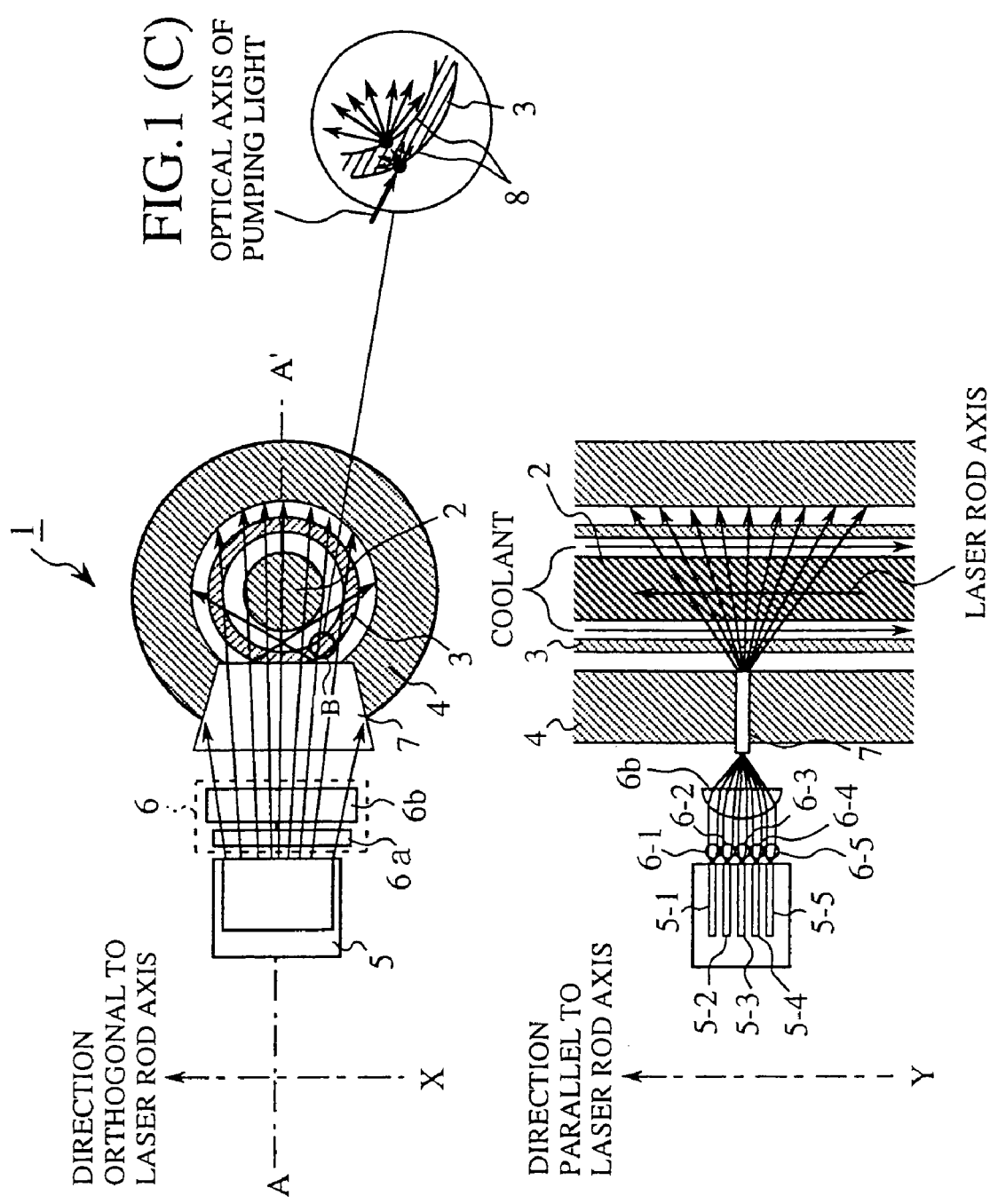

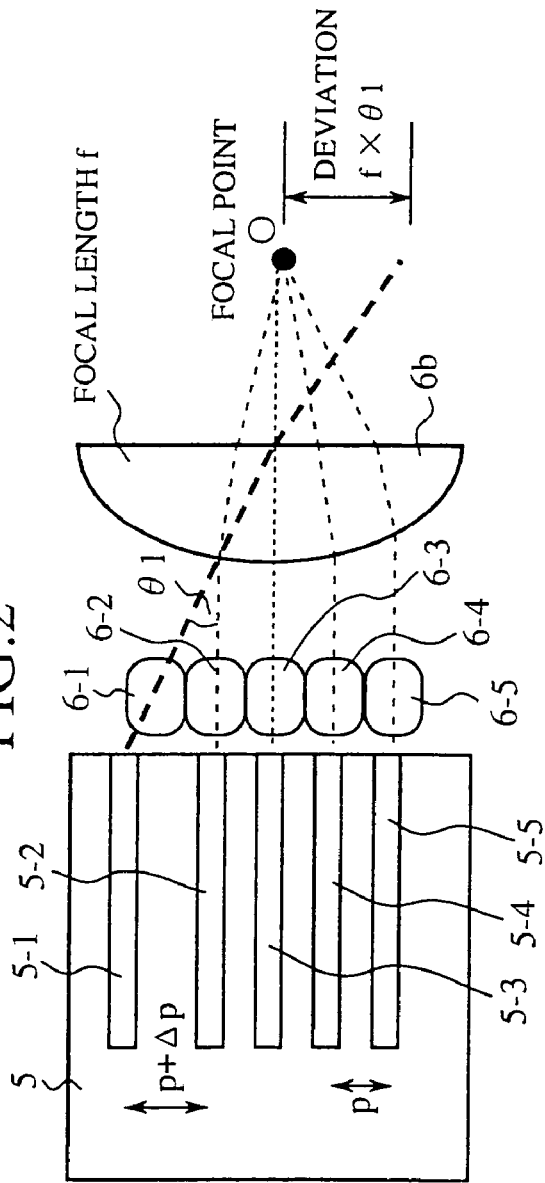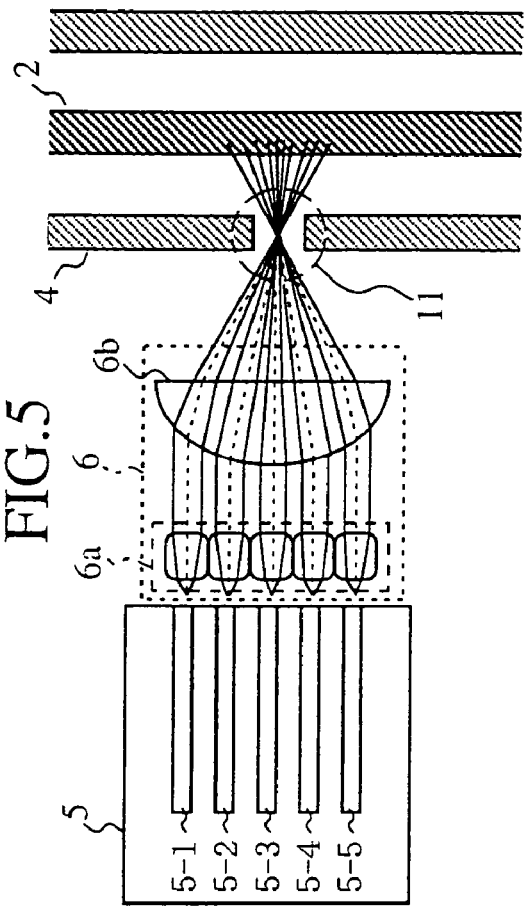

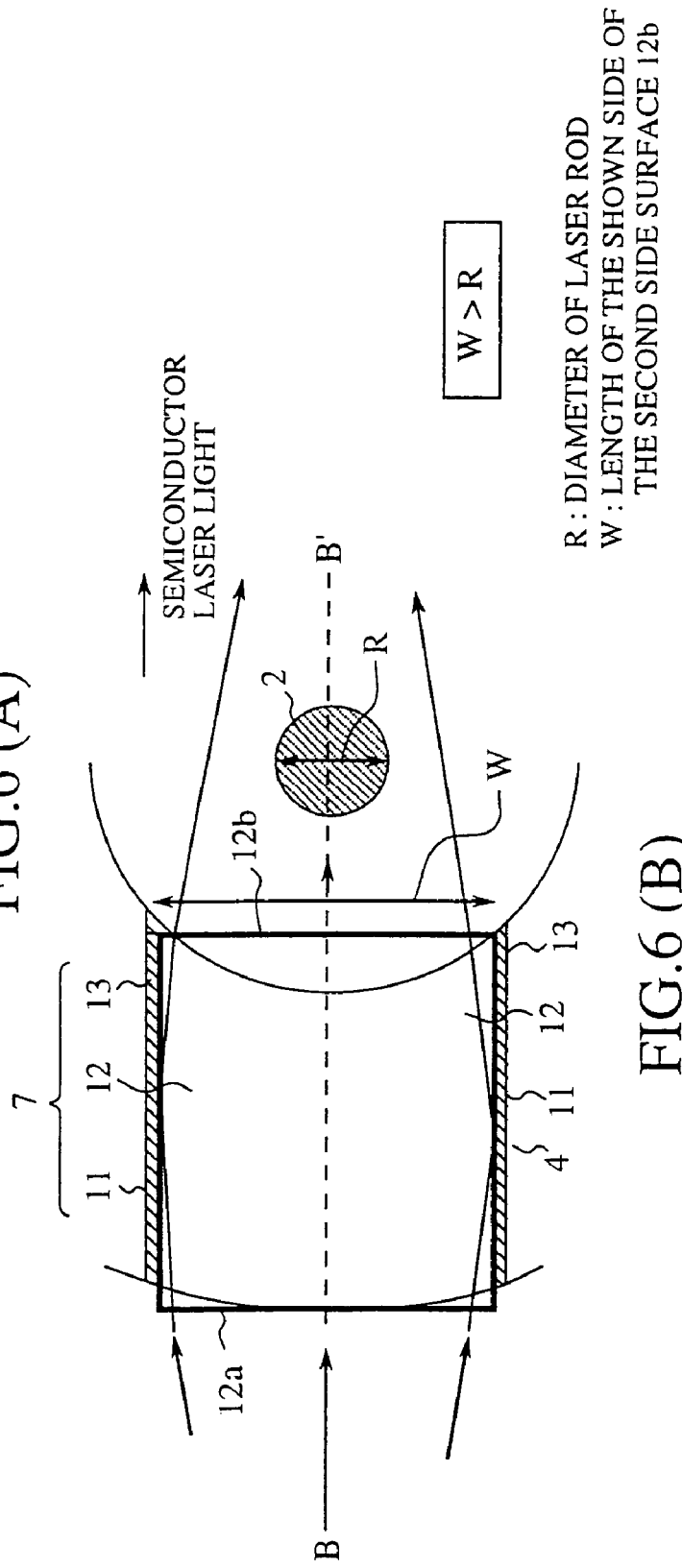
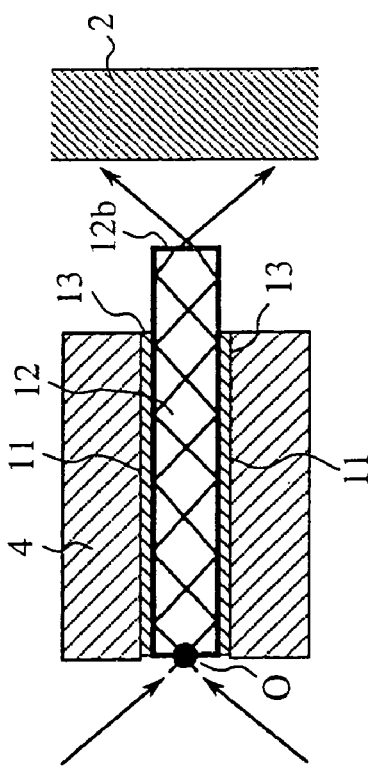
FIG.6 (A)
FIG.6 (B)
W > R
R : DIAMETER OF LASER ROD
W : LENGTH OF THE SHOWN SIDE OF THE SECOND SIDE SURFACE 12b

→ SEMICONDUCTOR LASER LIGHT WITH HIGH INTENSITY

→ SEMICONDUCTOR LASER LIGHT WHOSE INTENSITY IS REDUCED THROUGH ABSORPTION BY LASER ROD

→ SEMICONDUCTOR LASER LIGHT WITH HIGH INTENSITY

→ SEMICONDUCTOR LASER LIGHT WHOSE INTENSITY IS REDUCED BY SEMICONDUCTOR LASER LIGHT DIFFUSING COMPONENT

⟶ THE PATH OF A RAY OF LIGHT THAT DOES NOT ENTER SOLID-STATE LASER ROD

┈┈▶ THE PATH OF A RAY OF LIGHT THAT ENTERS SOLID-STATE LASER ROD

SEMICONDUCTOR LASER LIGHT EMITTING APPARATUS AND SOLID-STATE LASER ROD PUMPING MODULE

This application is a divisional of application Ser. No. 10/425,883, filed on Apr. 30, 2003, now U.S. Pat. No. 6,738,407 which is a divisional of prior application Ser. No. 09/404,205, filed on Sep. 23, 1999, and issuing and U.S. Pat. No. 6,594,299 on Jul. 15, 2003, which is a continuation-in-part of prior application Ser. No. 09/250,408 filed on Feb. 16, 1999, now abandoned the entire contents of which are hereby incorporated by reference and for which priority is claimed under 35 U.S.C. § 120; and this application claims priority of application Ser. Nos. 10-322512 filed in Japan on Nov. 12, 1998; 11-47083 filed in Japan on Feb. 24, 1999; and 11-129183 filed in Japan on May 10, 1999 under 35 U.S.C. § 119.

BACKGROUND OF THE INVENTION

1. Field of the Invention

The present invention relates to a semiconductor laser light emitting apparatus for emitting laser light using a semiconductor laser, and a solid-state laser rod pumping module for optical pumping a solid-state laser rod using semiconductor laser light so as to generate desired laser light. More particularly, it relates to a semiconductor laser light emitting apparatus for generating semiconductor laser light of high-density power with a high degree of efficiency using an array-type semiconductor laser or stack-type semiconductor laser, and a solid-state laser rod pumping module for pumping a solid-state laser rod using semiconductor laser light of high power with a high degree of efficiency so as to generate laser light having a high beam quality.

2. Description of the Prior Art

Semiconductor laser light emitting apparatuses are intended to generate combined semiconductor laser light of high power density using one or more laser light beams, each of which will be referred to as semiconductor laser light in most cases, emitted out of one or more semiconductor lasers. In order to pump a solid-state laser rod with high power and with a high degree of efficiency and then generate laser light having a high beam quality using such a semiconductor laser light emitting apparatus, it is preferable to increase the efficiency of energy utilization of the semiconductor laser light generated by the semiconductor laser light emitting apparatus. The energy utilization efficiency is directly affected by how the semiconductor laser light is focused to pump the solid-state laser rod.

In a prior art solid-state laser rod pumping module of side-pumped type intended for high power using an array-type semiconductor laser that includes a plurality of laser-light-emitting end portions integrated and stacked in the direction of a slow axis thereof, and that is placed so that the slow axis of the semiconductor laser is parallel to the axis of the solid-state laser rod, the solid-state laser rod cannot be pumped with a high degree of efficiency because of a small cross-sectional area of the solid-state laser rod in the case that the semiconductor laser light emitted out of the semiconductor laser passes through the solid-state laser rod only once. In general, such a semiconductor laser emits laser light whose near-field pattern is an ellipse according to its characteristics, the laser light having different divergence angles with respect to two axes perpendicular to the optical axis thereof (i.e., in two perpendicular longitudinal sections). The laser light has a smaller divergence angle with respect to the direction of one of the two axes, which will be referred to as slow axis, and has a larger divergence angle with respect to the direction of the other one of the two axes, which will be referred to as fast axis. To solve the above problem, a method of pumping the solid-state laser rod with a high degree of efficiency has been proposed, the method comprising the steps of injecting the semiconductor laser light into a reflection tube surrounding the solid-state laser rod, and trapping the semiconductor laser light within the reflection tube so that it passes through the solid-state laser rod a number of times.

In the case that the efficiency of trapping the semiconductor laser light within the reflection tube is high, the prior art method offers the advantage of being able to increase the efficiency of the optical pumping of the solid-state laser rod. However, in order to increase the efficiency of trapping the semiconductor laser light within the reflection tube, it is necessary to decrease the amount of light that can escape from the interior of the reflection tube via an injection hole formed in the wall of the reflection tube, through which the semiconductor laser light has been injected into the reflection tube, that is, to minimize the size of the injection hole.

In general, in order to generate laser light of high power, a stack-type semiconductor laser is used as the semiconductor laser for optical pumping the solid-state laser rod. A stack-type semiconductor laser includes a plurality of bar-shaped (or rectangular) components (or arrays) that are stacked in the direction of the fast axis of the semiconductor laser, each of the plurality of bar-shaped arrays including a plurality of laser-light-emitting end portions that are aligned and integrated in the direction of the slow axis.

In order to generate laser light having a high-beam quality by optical pumping a solid-state laser rod, there is a need to reduce the wave aberration caused by the solid-state laser rod itself because of heat generated by the optical pumping of the solid-state laser rod. To that end, it is desirable that the solid-state laser rod be an ideal grated refractive index lens, by illuminating the solid-state laser rod with semiconductor laser light as uniformly as possible, making the distribution of the light intensity of the semiconductor laser light incident on the solid-state laser rod axisymmetric with respect to the axis of the solid-state laser rod and uniform, and making the radial distribution of temperature in the solid-state laser rod second-order axisymmetric with respect to the axis of the solid-state laser rod.

However, in such a prior art solid-state laser rod pumping module, the radial distribution of temperature caused by the optical pumping of the solid-state laser rod using semiconductor laser light cannot be a second-order axisymmetric one because the semiconductor laser light is injected into only a part of the solid-state laser rod when it enters the reflection tube first after it has passed through the injection hole, i.e. part of the solid-state laser rod that is opposite to (or facing) the injection hole, without its laser intensity being reduced. Therefore, although the prior art solid-state laser rod pumping module is capable of generating laser light having average laser power up to about 1 kW if the beam quality does not matter, it can only generate laser light having average laser power of the order, at most, of about 100 Watts in the case that a high beam quality is needed.

Referring now to FIG. 19, there is illustrated a cross-sectional view showing a prior art solid-state laser rod pumping module as shown in, for example, S. Fujikawa et al., "High-power high-efficient diode-side-pumped Nd:YAG laser", technical digest of Advanced Solid-State Lasers '97, pp. 296–299, 1997. In the figure, reference numeral 101 denotes a solid-state laser rod pumping module, 102 denotes a solid-state laser rod, and 103 denotes a cooling sleeve that is shaped like a tube and is transparent to semiconductor laser light. The cooling sleeve 103 is disposed on substantially the same axis as the solid-state laser rod 102 so that it surrounds the solid-state laser rod 102. In the cooling sleeve 103, a coolant for the solid-state laser rod 102 is circulated. In addition, reference numeral 104 denotes a diffusive reflection tube for diffusively reflecting semiconductor laser light incident thereon, which is disposed on substantially the same axis as the solid-state laser rod 102 so that it surrounds the solid-state laser rod 102 and the cooling sleeve 103, the diffusive reflection tube 104 being able to trap the semiconductor laser light injected into the interior thereof, 105 denotes a semiconductor laser having a plurality of laser-light-emitting end portions that are aligned and integrated in a direction parallel to the axis of the solid-state laser rod 102. In the example shown, the solid-state laser rod 102 is located so that its axis is parallel to the slow axis of the semiconductor laser 105. The semiconductor laser light emitting apparatus included in the solid-state laser rod pumping module consists of the semiconductor laser 105 only. Furthermore, reference numeral 107 denotes a semiconductor laser light guiding component constructed of a sheet glass, which is inserted into the diffusive reflection tube 104.

Laser light emitted out of the semiconductor laser 105 is guided towards the solid-state laser rod 102 located within the diffusive reflection tube 104 while it is totally reflected off the upper and lower surfaces of the sheet glass, which is disposed as the semiconductor laser light guiding component 107. The semiconductor laser light injected into the interior of the diffusive reflection tube 104 then enters the solid-state laser rod 102 and is partially absorbed by the solid-state laser rod 102. The remainder of the semiconductor laser light passing through the solid-state laser rod 102 is diffusively reflected off the inner surface of the diffusive reflection tube 104, so that the diffusively reflected semiconductor laser light can be uniformly distributed within the diffusive reflection tube 104, as indicated by dashed lines shown in FIG. 19. The solid-state laser rod 102 is thus illuminated uniformly by the semiconductor laser light uniformly distributed within the diffusive reflection tube 104. Heat generated in the solid-state laser rod 102 is eliminated from the outer surface of the solid-state laser rod 102 by the coolant circulated in the cooling sleeve 103.

The solid-state laser rod pumping module 101 as shown in FIG. 19 can pump the solid-state laser rod 102 with a high degree of efficiency because the semiconductor laser light guiding component 107 constructed of the sheet glass occupies only a small part of the inner surface of the diffusive reflection tube 104 whose area is relatively small and the amount of semiconductor laser light that can escape from the interior of the diffusive reflection tube 104 is therefore small.

Referring next to FIGS. 20 and 21, there are illustrated diagrams showing a prior art semiconductor laser light emitting apparatus and another prior art solid-state laser rod pumping module including the semiconductor laser light emitting apparatus, respectively, as shown in, for example, H. Bruesselbach et al., "High-Power Side-Diode-Pumped Yb:YAG Laser", technical digest of Advanced Solid-State Lasers '97, pp. 285–287, 1997. FIG. 20 is a cross-sectional view of the semiconductor laser light emitting apparatus, the view being taken on the plane of the fast axis of a stack-type semiconductor laser included in the apparatus. FIG. 21 is a cross-sectional view of the solid-state laser rod pumping module including the semiconductor laser light emitting apparatus of FIG. 20, the view being taken on the plane perpendicular to the axis of a solid-state laser rod included in the solid-state laser rod pumping module. In the figure, reference numeral 111 denotes the solid-state laser rod pumping module, 112 denotes the solid-state laser rod, and 113 denotes a cooling sleeve that is shaped like a tube and is transparent to semiconductor laser light. The cooling sleeve 113 is disposed on substantially the same axis as the solid-state laser rod 112 so that it surrounds the solid-state laser rod 112. In the cooling sleeve 113, a coolant for the solid-state laser rod 112 is circulated. In addition, reference numeral 114 denotes a mirror-reflective reflection tube that is so shaped as to mirror-reflect semiconductor laser light injected into the interior thereof, which is disposed on substantially the same axis as the solid-state laser rod 112 so that it surrounds the solid-state laser rod 112 and the cooling sleeve 113.

Reference numeral 121 denotes the stack-type semiconductor laser including a plurality of bar-shaped components (or arrays) 121-1 to 121-5 that are stacked in the direction of the fast axis thereof, each of the plurality of bar-shaped components 121-1 to 121-5 having a plurality of laser-light-emitting end portions that are aligned and integrated in the direction of the slow axis of the stack-type semiconductor laser, 122 denotes a semiconductor laser light focusing component for focusing laser beams emitted out of the stack-type semiconductor laser 121 to an injection hole, and 122-1 to 122-5 denote cylindrical lenses that are opposite to the respective bar-shaped components 121-1 to 121-5 of the stack-type semiconductor laser 121 and that are located at a distance, which is substantially equal to the focal length of the cylindrical lenses, from the respective bar-shaped components 121-1 to 121-5. Each of the plurality of cylindrical lenses 122-1 to 122-5 serves to collimate the laser beam emitted out of each of the plurality of bar-shaped components 121-1 to 121-5 of the stack-type semiconductor laser. Furthermore, reference numeral 122a denotes a cylindrical lens array comprised of the plurality of cylindrical lenses 122-1 to 122-5 that are stacked in a direction parallel to the direction in which the plurality of bar-shaped components 121-1 to 121-5 are stacked, at the same intervals as the plurality of bar-shaped components 121-1 to 121-5 stacked, and 122b denotes a focusing lens lot for focusing the plurality of semiconductor laser beams collimated by the plurality of cylindrical lenses 122-1 to 122-5 with respect to a direction parallel to the direction in which the plurality of bar-shaped components 121-1 to 121-5 are stacked (i.e., the direction of the fast axis), to a linear cross section having a longer side running in the same direction as the axis of the solid-state laser rod 112. The semiconductor laser light emitting apparatus consists of the stack-type semiconductor laser 121, cylindrical lens array 122a, and focusing lens lot 122b.

Reference numeral 117 denotes a semiconductor laser light guiding component formed on the mirror reflection tube 114, for guiding the semiconductor laser light, which has been emitted out of the semiconductor laser apparatus comprised of the stack-type semiconductor laser 121, cylindrical lens array 122a, and focusing lens lot 122b, into the interior of the mirror-reflective reflection tube 114. The mirror-reflective reflection tube 114 is constructed of a coating of high reflectivity formed on the outer surface of the cooling sleeve 113. On the other hand, the semiconductor laser light guiding component 117 is constructed of an anti-reflection coating shaped like a slit and formed on the outer surface of the cooling sleeve 113. The outer surface of the cooling sleeve 113 is thus covered by both the high-reflective coating that serves as the mirror-reflective reflection tube 114 and the slit-shaped anti-reflection coating that serves as the semiconductor laser light guiding component 117.

The laser light emitted out of each of the plurality of bar-shaped components 121-1 to 121-5 has a divergence angle of about 10 degrees with respect to the direction of the slow axis (i.e., in a longitudinal section of the laser light including the slow axis), and a divergence angle of about 30 to 50 degrees with respect to the direction of the fast axis (i.e., in a longitudinal section of the laser light including the fast axis). Each of the plurality of cylindrical lenses 122-1 to 122-5, which is opposite to each of the plurality of bar-shaped components 121-1 to 121-5, mainly collimates a component of the laser light emitted out of each of the plurality of bar-shaped components 121-1 to 121-5, which is diverging with respect to the direction of the fast axis. The focusing lens lot 122b can focus the collimated semiconductor laser light to a linear cross section at the focal point thereof. The focused semiconductor laser light is then injected into the interior of the mirror-reflective reflection tube 114 by way of the semiconductor laser light guiding component 117 constructed from the anti-reflection coating located in the vicinity of the focal point where the collimated semiconductor laser light is focused. The incident semiconductor laser light then enters the solid-state laser rod 112 and is partially absorbed by the solid-state laser rod 112. The remainder of the semiconductor laser light, which has not been absorbed by the solid-state laser rod 112, is reflected off the high-reflective coating of the mirror-reflective reflection tube 114, and it then enters the solid-state laser rod 112 again and is partially absorbed by the solid-state laser rod 112.

A problem with the prior art solid-state laser rod pumping module as shown in FIG. 19 is that the semiconductor laser 105 cannot pump the solid-state laser rod 102 with a large amount of electrical power, because laser light emitted out of the semiconductor laser 105 including the plurality of laser-light-emitting end portions stacked in the direction of the slow axis has to enter the solid-state laser rod 102 by way of the semiconductor laser light guiding component 107 with a small cross-section. Thus, the prior art solid-state laser rod pumping module as shown in FIG. 19 is not suitable for improvements in the output power of the solid-state laser.

The semiconductor laser light, which has been guided into the interior of the diffusive reflection tube 104 by the semiconductor laser light guiding component 107 constructed of the thin plate glass, enters the solid-state laser rod 102 first. That is, the semiconductor laser light enters the part of the solid-state laser rod 102 that is opposite to the output surface of the semiconductor laser light guiding component 107, without its laser intensity being reduced. As a result, the laser-light intensity distribution of the semiconductor laser light within the solid-state laser rod 102 has a peak on the side of the rod facing the semiconductor laser light guiding component 107. Another problem with the prior art laser rod pumping module as shown in FIG. 19 is thus that the laser-light intensity distribution of the semiconductor laser light within the solid-state laser rod 102 is not axisymmetric with respect to the axis of the rod and is not uniform, and therefore the radial distribution of temperature in the solid-state laser rod 102, which is caused by the absorption of the semiconductor laser light, deviates from a second-order axisymmetric one. As a result, the solid-state laser rod 102 serves as a grated refractive index lens having wave aberration.

A problem with the other prior art solid-state laser rod pumping module, as shown in FIGS. 20 and 21, including the prior art semiconductor laser is that it is clear from the viewpoint of the geometry of the module that part of the incident semiconductor laser light, which has not entered the solid-state laser rod 102 immediately after it was guided into the interior of the mirror reflection tube 114 by way of the semiconductor laser light guiding component 117, cannot enter the solid-state laser rod 112 even if it is reflected off the mirror reflection tube 114 a number of times, as shown in FIG. 22. The solid line of FIG. 22 designates such a ray of light that cannot enter the solid-state laser rod 112. In order to cause the semiconductor laser light to be absorbed with a high degree of efficiency by the solid-state laser rod 2, there is a need to vary the focal length of the focusing lens lot 122b so that the converging angle of the focusing lens lot 122b falls within an angle that is formed by two lines connecting both edges of the solid-state laser rod 112 with the semiconductor laser light guiding component 117 when viewed from the semiconductor laser light guiding component 117 in one plane perpendicular to the axis of the solid-state laser rod 112. On the other hand, the transverse size of the focused semiconductor laser light beam at the focal point of the focusing lens lot 122b is uniquely determined by the focal length of the focusing lens lot 122b. The transverse size is the length of one side of a cross section of the semiconductor laser light beam at the focal point of the focusing lens lot, the side running in a direction parallel to the direction in which the plurality of bar-shaped components 121-1 to 121-5 are stacked (i.e., in a direction orthogonal to the axis of the solid-state laser rod 112, or in the direction of the fast axis). Therefore, the transverse size of the semiconductor laser light beam at the focal point of the focusing lens lot 122b cannot be a minimum one obtained by means of the focusing lens lot 122b, thereby reducing the efficiency of energy utilization of the semiconductor laser light. This results in the need for an increase in the size of the semiconductor laser light guiding component 117. Another problem with the other prior art solid-state laser rod pumping module is thus that the efficiency of trapping the semiconductor laser light within the mirror-reflective reflection tube 114 is reduced.

The transverse size of the focused semiconductor laser light beam at the focal point of the focusing lens lot 122b can be theoretically calculated using (d1*f2/f1), where d1 is the transverse size of the semiconductor laser light beam at the light-emitting end portion of each bar-shaped component of the stack-type semiconductor laser, f1 is the focal length of each of the plurality of cylindrical lenses 122-1 to 122-5 of the cylindrical lens array 122a, and f2 is the focal length of the focusing lens lot 122b. Actually, the focused semiconductor laser light beam has a larger transverse size because of variations in the intervals at which the plurality of bar-shaped components 121-1 to 121-5 are stacked, pitch errors in the plurality of cylindrical lenses 122-1 to 122-5 of the cylindrical lens array 122a, and a variation in the position of the cylindrical lens array 122a.

If the size of the semiconductor laser light guiding component 117 is reduced in order to improve the efficiency of trapping the semiconductor laser light within the mirror-reflective reflection tube 114, the transverse size of the focused semiconductor laser light beam at the focal point of the focusing lens lot 116b can become larger than the size of the semiconductor laser light guiding component 117. Another problem with the other prior art solid-state laser rod pumping module is thus that the ratio of the amount of semiconductor laser light guided into the interior of the mirror-reflective reflection rube 114 to the total amount of the semiconductor laser light focused onto the semiconductor laser light guiding component 117 is reduced, and this results in reducing the ratio of the amount of semiconductor laser light absorbed by the solid-state laser rod 112 to the total amount of the semiconductor laser light focused onto the semiconductor laser light guiding component 117. In the other prior art solid-state laser rod pumping module as shown in FIGS. 20 and 21, the ratio of the amount of semiconductor laser light absorbed by the solid-state laser rod 112 to the total amount of the semiconductor laser light emerging from the cylindrical lens array 122a is as small as 26%.

The semiconductor laser light guided into the interior of the mirror-reflective reflection tube 114 by way of the semiconductor laser light guiding component 117 enters the solid-state laser rod 112 first. In the case that the solid-state laser rod 112 has a large absorption coefficient, the intensity of semiconductor laser light reflected off the mirror-reflective reflection tube 114 becomes much less than that of the semiconductor laser light incident on part of the solid-state laser rod 112, which is opposite to the output surface of the semiconductor laser light guiding component 117. As a result, the laser-light intensity distribution of the semiconductor laser light within the solid-state laser rod 112 has a peak on the side of the rod facing the semiconductor laser light guiding component 117. Another problem is thus that the laser-light intensity distribution of the semiconductor laser light within the solid-state laser rod 112 is not axisymmetric with respect to the axis of the rod and is not uniform, and therefore, the radial distribution of temperature in the solid-state laser rod 112, which is caused by the absorption of the semiconductor laser light, deviates from a second-order axisymmetric one. As a result, the solid-state laser rod 112 serves as a grated refractive index lens having wave aberration.

In addition, since the stack-type semiconductor laser for use in the other prior art solid-state laser rod pumping module as shown in FIGS. 20 and 21 is constructed of the plurality of bar-shaped components that are stacked in the direction of the fast axis, each of the plurality of bar-shaped components including a plurality of laser-light-emitting end portions aligned and integrated in the direction of the slow axis, laser light emitted out of the stack-type semiconductor laser light has a large divergence angle with respect to a direction perpendicular to the axis of the solid-state laser rod (i.e., the direction of the fast axis), and a small divergence angle with respect to a direction parallel to the axis of the solid-state laser rod (i.e., the direction of the slow axis). Another problem is thus that although the semiconductor laser light entering the interior of the mirror-reflective reflection tube diverges largely with respect to a direction perpendicular to the axis of the solid-state laser rod, all rays of the semiconductor laser light having a small divergence angle with respect to a direction parallel to the axis of the solid-state laser rod are concentrated onto part of the solid-state laser rod which is opposite to the output surface of the semiconductor laser light guiding component 117.

Furthermore, another problem with the other prior art solid-state laser rod pumping module, as shown in FIGS. 20 and 21, including the prior art semiconductor laser, is that when the semiconductor laser light focusing component includes an aspherical lens instead of the focusing lens let 122b, the laser light beam emerging from the aspherical lens can diverge and then has a larger transverse size than the aspherical lens, according to the transverse size of the semiconductor laser light beam in the direction of the slow axis, at a distance from the semiconductor laser.

SUMMARY OF THE INVENTION

The present invention is made to overcome the above problems. It is therefore an object of the present invention to provide a compact semiconductor laser light emitting apparatus capable of generating combined laser light having a high power density with a high degree of efficiency, and a solid-state laser rod pumping module capable of pumping a solid-state laser rod with high power and with a high degree of efficiency, thereby causing the solid-state laser rod to generate laser light with a high beam quality.

In accordance with one aspect of the present invention, there is provided a solid-state laser rod pumping module comprising: a cooling sleeve disposed on substantially the same axis as a solid-state laser rod so that it surrounds the solid-state laser rod; a diffusive reflection tube disposed on substantially the same axis as the solid-state laser rod so that it surrounds the solid-state laser rod and the cooling sleeve; a stack-type semiconductor laser including a plurality of bar-shaped (or rectangular) components that are stacked in a direction parallel to the axis of the solid-state laser rod, each of the plurality of bar-shaped components including a plurality of laser-light-emitting portions that are aligned and integrated in a direction orthogonal to the axis of the solid-state laser rod; a semiconductor laser light focusing component for focusing laser light emitted out of the stack-type semiconductor laser; and a semiconductor laser light guiding component disposed in the diffusive reflection tube, for guiding the laser light focused and injected thereinto by the semiconductor laser light focusing component to an end portion thereof while substantially maintaining the length of one side of a cross section of the semiconductor laser light, which is running in a direction parallel to the direction in which the plurality of bar-shaped components are stacked, and for guiding the laser light toward the solid-state laser rod located within the diffusive reflection tube.

Preferably, the solid-state laser rod pumping module further comprises a semiconductor laser light diffusing component disposed between the semiconductor laser light guiding component and the solid-state laser rod, for diffusing the laser light guided by the semiconductor laser light guiding component.

In accordance with a preferred embodiment of the present invention, the semiconductor laser light focusing component includes a cylindrical lens array having a plurality of cylindrical lenses that are stacked, in a direction parallel to the direction in which the plurality of bar-shaped components of the stack-type semiconductor laser are stacked, at the same intervals as the plurality of bar-shaped components of the stack-type semiconductor laser, and an aspherical lens for refracting light incident thereon with respect to a direction parallel to the direction in which the plurality of bar-shaped components of the stack-type semiconductor laser are stacked. Further, each of the plurality of cylindrical lenses of the cylindrical lens array is opposite to a corresponding one of the plurality of bar-shaped components of the stack-type semiconductor laser and is located at substantially its focal distance from the corresponding bar-shaped component, and the aspherical lens is located between the cylindrical lens array and the semiconductor laser light guiding component and at substantially its focal distance from the semiconductor laser light guiding component. The focal length of the aspherical lens can be equal to or greater than $(0.5 \times L)$, where L is the beam width of the laser light passing through the cylindrical lens array with respect to a direction parallel to the direction in which the plurality of bar-shaped components of the stack-type semiconductor laser are stacked.

In accordance with another preferred embodiment of the present invention, the semiconductor laser light focusing component includes an aspherical composite lens into which the cylindrical lens array and the aspherical lens are integrated.

Preferably, the semiconductor laser light guiding component includes a slit formed in the diffusive reflection tube, a hexahedron-shaped slab wave guide located in the slit, and an adhesive layer formed in space between faces of the slab wave guide other than a first face via which the laser light is incident on the slab wave guide and a second face via which the laser light emerges from the slab wave guide, and the slit, the adhesive layer having a lower refractive index than the slab wave guide. The area of the first face of the slab wave guide can be less than that of the second face of the slab wave guide, and the length of one side of the second face, running in a direction orthogonal to the axis of the solid-state laser rod, can be greater than the diameter of the solid-state laser rod.

In accordance with another preferred embodiment of the present invention, the semiconductor laser light diffusing component is made of a transparent optical material whose surface is ground or rough like a ground glass. The semiconductor laser light diffusing component can be formed on the cooling sleeve. Preferably, the semiconductor laser light diffusing component can be made of sapphire whose surface is ground or rough like a ground glass.

As an alternative, the semiconductor laser light diffusing component is made of a transparent foaming glass material including bubbles therein.

In accordance with another preferred embodiment of the present invention, the module comprises a plurality of semiconductor laser light illuminating units arranged around the solid-state laser rod, each of the plurality of semiconductor laser light illuminating units including the stack-type semiconductor laser, the semiconductor laser light focusing component, and the semiconductor laser light guiding component. Preferably, each of the plurality of semiconductor laser light illuminating units includes a semiconductor laser light diffusing component disposed between the semiconductor laser light guiding component thereof and the solid-state laser rod, for diffusing the laser light guided by the semiconductor laser light guiding component thereof.

In accordance with another aspect of the present invention, there is provided a solid-state laser rod pumping module comprising: a cooling sleeve disposed on substantially the same axis as a solid-state laser rod so that it surrounds the solid-state laser rod; a mirror-reflective reflection tube disposed on substantially the same axis as the solid-state laser rod so that it surrounds the solid-state laser rod and the cooling sleeve; a stack-type semiconductor laser including a plurality of bar-shaped (or rectangular) components that are stacked in a direction parallel to the axis of the solid-state laser rod, each of the plurality of bar-shaped components including a plurality of laser-light-emitting portions that are integrated and aligned in a direction orthogonal to the axis of the solid-state laser rod; a semiconductor laser light focusing component for focusing laser light emitted out of the stack-type semiconductor laser; a semiconductor laser light guiding component disposed in the mirror-reflective reflection tube, for guiding the laser light focused and injected thereinto by the semiconductor laser light focusing component to an end portion thereof while substantially maintaining the length of one side of a cross section of the semiconductor laser light, which is running in a direction parallel to the direction in which the plurality of bar-shaped components are stacked, and for guiding the laser light toward the solid-state laser rod located within the mirror-reflective reflection tube; and a semiconductor laser light diffusing component disposed between the semiconductor laser light guiding component and the solid-state laser rod, for diffusing the laser light guided by the semiconductor laser light guiding component.

Preferably, the semiconductor laser light focusing component includes a cylindrical lens array having a plurality of cylindrical lenses that are stacked in a direction parallel to the direction in which the plurality of bar-shaped components of the stack-type semiconductor laser are stacked at the same intervals as the plurality of bar-shaped components of the stack-type semiconductor laser, and an aspherical lens for refracting light incident thereon with respect to a direction parallel to the direction in which the plurality of bar-shaped components of the stack-type semiconductor laser are stacked. Further, each of the plurality of cylindrical lenses of the cylindrical lens array is opposite to a corresponding one of the plurality of bar-shaped components of the stack-type semiconductor laser and is located at substantially its focal distance from the corresponding bar-shaped component, and the aspherical lens is located between the cylindrical lens array and the semiconductor laser light guiding component and at substantially its focal distance from the semiconductor laser light guiding component. The focal length of the aspherical lens can be equal to or greater than $(0.5 \times L)$, where L is the beam width of the laser light passing through the cylindrical lens array with respect to a direction parallel to the direction in which the plurality of bar-shaped components of the stack-type semiconductor laser are stacked.

In accordance with another preferred embodiment of the present invention, the semiconductor laser light focusing component includes an aspherical composite lens into which the cylindrical lens array and the aspherical lens are integrated.

In accordance with another preferred embodiment of the present invention, the semiconductor laser light diffusing component is made of a transparent optical material whose surface is ground or rough like a ground glass. The semiconductor laser light diffusing component can be formed on the cooling sleeve. Preferably, the semiconductor laser light diffusing component can be made of sapphire whose surface is ground or rough like a ground glass.

As an alternative, the semiconductor laser light diffusing component is made of a transparent foaming glass material including bubbles therein.

In accordance with another preferred embodiment of the present invention, the module comprises a plurality of semiconductor laser light illuminating units arranged around the solid-state laser rod, each of the plurality of semiconductor laser light illuminating units including the stack-type semiconductor laser, the semiconductor laser light focusing component, the semiconductor laser light guiding component, and the semiconductor laser light diffusing component.

In accordance with another aspect of the present invention, there is provided a semiconductor laser light emitting apparatus comprising: a semiconductor laser provided with at least a bar-shaped component including a plurality of laser-light-emitting portions aligned and integrated in a direction of a slow axis of the semiconductor laser; a semiconductor laser light focusing component for focusing laser light emitted out of the semiconductor laser with respect to a direction of a fast axis of the semiconductor laser; and a semiconductor laser light refracting component for refracting all rays or some rays of the laser light emitted out of the semiconductor laser with respect to the direction of the slow axis of the semiconductor laser. The semiconductor laser can be an array-type semiconductor laser having only one bar-shaped component including a plurality of laser-light-emitting portions aligned and integrated in the direction of the slow axis of the semiconductor laser. As an alternative, the semiconductor laser can be a stack-type semiconductor laser having a plurality of bar-shaped components that are stacked in the direction of the fast axis of the semiconductor laser, each of the plurality of bar-shaped components including a plurality of laser-light-emitting portions aligned and integrated in the direction of the slow axis of the semiconductor laser.

Preferably, the semiconductor laser light refracting component can be a roof prism having a ridgeline that is parallel to the fast axis of the semiconductor laser, the roof prism being placed so that one face thereof opposite to the ridgeline is substantially perpendicular to a direction in which the laser light emitted out of the semiconductor laser travels. As an alternative, the semiconductor laser light refracting component can be a quadrangular prism having a trapezoidal cross section, whose two parallel lateral faces are substantially perpendicular to a direction in which the laser light emitted out of the semiconductor laser travels.

In accordance with another aspect of the present invention, there is provided a solid-state laser rod pumping module comprising: a cooling sleeve disposed on substantially the same axis as a solid-state laser rod so that it surrounds the solid-state laser rod; a diffusive reflection tube disposed on substantially the same axis as the solid-state laser rod so that it surrounds the solid-state laser rod and the cooling sleeve; the semiconductor laser light emitting apparatus, as mentioned above, being configured so that the slow axis of the semiconductor laser included therein is parallel to the axis of the solid-state laser rod, for emitting the laser light towards the diffusive reflection tube; and a semiconductor laser light guiding component disposed in the diffusive reflection tube, for guiding the laser light emitted out of the semiconductor laser light emitting apparatus and incident thereon to an end portion thereof while substantially maintaining the length of one side of a cross section of the laser light emitted out of the semiconductor laser light emitting apparatus, the side running in a direction parallel to the fast axis, and for guiding the laser light toward the solid-state laser rod located within the diffusive reflection tube. In the semiconductor laser light emitting apparatus, the semiconductor laser can be alternatively placed so that the fast axis of the semiconductor laser is parallel to the axis of the solid-state laser rod.

Preferably, the semiconductor laser light guiding component can include a slit formed in the diffusive reflection tube, a hexahedron-shaped slab wave guide located in the slit, and an adhesive layer formed in space between faces of the slab wave guide other than a first face via which the laser light is incident on the slab wave guide and a second face via which the laser light emerges from the slab wave guide, and the slit, the adhesive layer having a lower refractive index than the slab wave guide. The area of the first face of the slab wave guide can be less than that of the second face of the slab wave guide, and the length of one side of the second face running in a direction orthogonal to the axis of the solid-state laser rod can be greater than the diameter of the solid-state laser rod. Preferably, the slab wave guide is so constructed that the laser light incident thereon is reflected off one face of the slab wave guide, which is parallel to the fast axis of the array-type semiconductor laser, at most once while it travels within the slab wave guide.

In accordance with another aspect of the present invention, there is provided a solid-state laser rod pumping module comprising: a cooling sleeve disposed on substantially the same axis as a solid-state laser rod so that it surrounds the solid-state laser rod; a mirror-reflective reflection tube disposed on substantially the same axis as the solid-state laser rod so that it surrounds the solid-state laser rod and the cooling sleeve; the semiconductor laser light emitting apparatus, as mentioned above, being configured so that the slow axis of the semiconductor laser included therein is parallel to the axis of the solid-state laser rod, for emitting the laser light towards the mirror-reflective reflection tube; and a semiconductor laser light guiding component disposed in the mirror-reflective reflection tube, for guiding the laser light emitted out of the semiconductor laser light emitting apparatus and incident thereon to an end portion thereof while substantially maintaining the length of one side of a cross section of the laser light emitted out of the semiconductor laser light emitting apparatus, the side running in a direction parallel to the fast axis, and for guiding the laser light toward the solid-state laser rod located within the mirror-reflective reflection tube. In the semiconductor laser light emitting apparatus, the semiconductor laser can be alternatively placed so that the fast axis of the semiconductor laser is parallel to the axis of the solid-state laser rod.

In either one of the fourth and fifth aspects of the present invention, the solid-state laser rod pumping module can further comprise a semiconductor laser light diffusing component disposed between the semiconductor laser light guiding component and the solid-state laser rod, for diffusing the laser light guided by the semiconductor laser light guiding component.

The semiconductor laser light diffusing component can be made of a transparent optical material whose surface is ground or rough like ground glass. The semiconductor laser light diffusing component can be formed on the cooling sleeve. Preferably, the semiconductor laser light diffusing component is made of sapphire whose surface is ground or rough like ground glass. As an alternative, the semiconductor laser light diffusing component is made of a transparent foaming glass material including bubbles therein.

Further objects and advantages of the present invention will be apparent from the following description of the preferred embodiments of the invention as illustrated in the accompanying drawings.

BRIEF DESCRIPTION OF THE DRAWINGS

FIG. 1(A) is a cross-sectional view showing the structure of a solid-state laser rod pumping module according to a first embodiment of the present invention.

FIG. 1(B) is a cross-sectional view taken along the line A–A' of FIG. 1(A);

FIG. 1(C) is an enlarged view of a part B of FIG. 1(A);

FIG. 2 is a cross-sectional view showing the operation of a semiconductor laser light focusing component for use in the solid-state laser rod pumping module according to the first embodiment of the present invention when one bar-shaped component of a semiconductor laser is out of place;

FIG. 5 is a cross-sectional view showing a semiconductor laser light guiding component in which only a slit is disposed, for an explanation of the disadvantage of this configuration;

FIG. 6(A) is a cross-sectional view showing the structure of an example of the semiconductor laser light component for use in the solid-state laser rod pumping module according to the first embodiment of the present invention;

FIG. 6(B) is a cross-sectional view taken along the line B–B' of FIG. 6(A);

DETAILED DESCRIPTION OF THE PREFERRED EMBODIMENTS

First Embodiment

Figure 3:
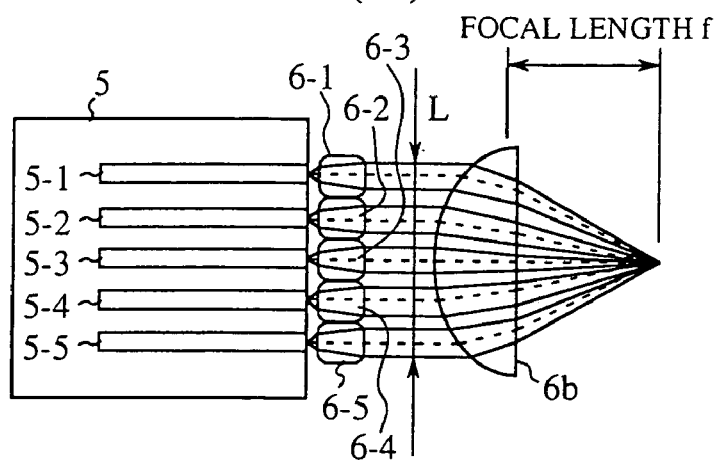
FIG. 3(A) is a cross-sectional view showing a configuration of a cylindrical lens array and an aspherical lens included in the semiconductor laser light focusing component for use in the solid-state laser rod pumping module according to the first embodiment of the present invention.
FIG. 3(B) is a graph showing the transverse size of a semiconductor laser light beam at the focal point of the aspherical lens of FIG. 3(A), which is plotted as a function of the normalized focal length of the aspherical lens.
Figure 3:
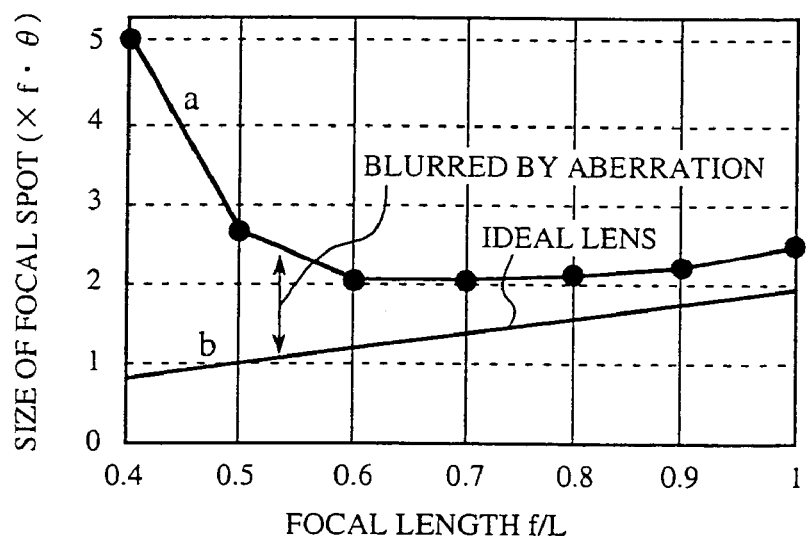

Referring next to FIGS. 1(A), 1(B), and 1(C), there are illustrated respective cross-sectional views showing a solid-state laser rod pumping module according to a first embodiment of the present invention. FIG. 1(B) is a cross-sectional view taken along the line A–A' of FIG. 1(A), and FIG. 1(C) is an enlarged view of the part B of FIG. 1(A). In the figures, reference numeral 1 denotes a solid-state laser rod pumping module, 2 denotes a solid-state laser rod, and 3 denotes a cooling sleeve that is shaped like a tube and is transparent to incident semiconductor laser light. The cooling sleeve 3 is disposed on substantially the same axis as the solid-state laser rod 2 so that it surrounds the solid-state laser rod 2. Within the interior of the cooling sleeve 3, a coolant for the solid-state laser rod 2 is circulated. In addition, reference numeral 4 denotes a diffusive reflection tube that is so constructed as to diffusively reflect semiconductor laser light incident on its inner surface, which is disposed on substantially the same axis as the solid-state laser rod 2 so that it surrounds the solid-state laser rod 2 and the cooling sleeve 3, and 5-1 to 5-5 respectively denote a plurality of bar-shaped (or rectangular) components (or arrays) that construct a stack-type semiconductor laser 5. The stack-type semiconductor laser 5 is comprised of the plurality of bar-shaped components 5-1 to 5-5 that are stacked in the direction of the fast axis of the semiconductor laser. In each of the plurality of bar-shaped arrays 5-1 to 5-5 of the stack-type semiconductor laser, a plurality of laser-light-emitting end portions are aligned and integrated in the direction of the slow axis of the semiconductor laser. The stack-type semiconductor laser 5 is arranged so that its slow axis is perpendicular to the axis of the solid-state laser rod 2 and hence its fast axis is parallel to the axis of the solid-state laser rod 2. Laser light emitted out each of the plurality of bar-shaped components 5-1 to 5-5 has a divergence angle of about 10 degrees with respect to a direction perpendicular to the axis of the solid-state laser rod 2, and a divergence angle of about 30 degrees with respect to a direction parallel to the axis of the solid-state laser rod 2.

Reference numeral 6 denotes a semiconductor laser light focusing component for focusing all rays of laser light emitted out of the stack-type semiconductor laser 5, and 6-1 to 6-5 denote a plurality of cylindrical lenses of a two-dimensional cylindrical lens array 6a, which are opposite to (or facing) the respective bar-shaped components 5-1 to 5-5 of the stack-type semiconductor laser 5 and which are located at a distance that is substantially equal to the focal length of the plurality of cylindrical lenses 6-1 to 6-5, from the respective bar-shaped components 5-1 to 5-5. Each of the plurality of cylindrical lenses 6-1 to 6-5 of the cylindrical lens array 6a serves to collimate the laser beam emitted out of the corresponding one of the plurality of bar-shaped components 5-1 to 5-5 of the stack-type semiconductor laser. Furthermore, reference numeral 6b denotes an aspherical lens. The semiconductor laser light focusing component 6 is comprised of the cylindrical lens array 6a and the aspherical lens 6b. The stack-type semiconductor laser 5 and the semiconductor laser light focusing component 6 constitute a semiconductor laser light emitting apparatus 5a. In addition, reference numeral 7 denotes a semiconductor laser light guiding component formed in the diffusive reflection tube 4, for guiding the semiconductor laser light focused and injected thereinto by the semiconductor laser focusing component 6 to one end portion thereof while substantially maintaining the length of one side of a cross section of the incident semiconductor laser light, which is running in a direction parallel to the direction in which the plurality of bar-shaped components 5-1 to 5-5 are stacked, and for guiding the semiconductor laser light toward the solid-state laser rod 2 located within the diffusive reflection tube 4, and 8 denotes a semiconductor laser light diffusing component formed on the outer surface of the cooling sleeve 3, for diffusing the semiconductor laser light guided thereto by the semiconductor laser light guiding component 7. In FIG. 1(A), the arrow X shows the direction orthogonal to the axis of the solid-state laser rod 2. In FIG. 1(B), the arrow Y shows the direction parallel to the axis of the solid-state laser rod 2. The arrows showing the flow of the coolant are also shown in FIG. 1(B).

FIG. 1 shows the case that the stack-type semiconductor laser 5 has five bar-shaped components and the cylindrical lens array 6a has five cylindrical lenses, as an example. It is apparent from the above description that the stack-type semiconductor laser 5 can have six or more bar-shaped components and the cylindrical lens array 6a can have six or more cylindrical lenses. Furthermore, FIG. 1 shows the case that the solid-state laser rod pumping module includes one stack-type semiconductor laser 5, one semiconductor laser light focusing component 6, and one semiconductor laser light guiding component 7, as an example. As an alternative, the solid-state laser rod pumping module can include a plurality of stack-type semiconductor lasers 5, a plurality of semiconductor laser light focusing components 6, and a plurality of semiconductor laser light guiding components 7 that are so constructed as shown in FIG. 1 and that are aligned around the axis of the solid-state laser rod 2.

Next, a detailed description will be made as to the semiconductor laser light focusing component 6, the semiconductor laser light guiding component 7, and the semiconductor laser light diffusing component 8. After that, the description will be directed to the operation of the solid-state laser rod pumping module 1 of the first embodiment.

1. Semiconductor Laser Light Emitting Apparatus (a) Stack-Type Semiconductor Laser As previously mentioned, the stack-type semiconductor laser 5 shown in FIGS. 1(A) to 1(C) is constructed so that the plurality of bar-shaped components are stacked in the direction of the fast axis, each of the plurality of bar-shaped components including the plurality of laser-light-emitting end portions aligned and integrated in the direction of the slow axis of the semiconductor laser. The stack-type semiconductor laser 5 is arranged so that its slow axis is perpendicular to the axis of the solid-state laser rod 2 and hence its fast axis is parallel to the axis of the solid-state laser rod 2. Laser light emitted out each of the plurality of bar-shaped components 5-1 to 5-5 has a divergence angle of about 10 degrees with respect to a direction perpendicular to the axis of the solid-state laser rod 2, and a divergence angle of about 30 degrees with respect to a direction parallel to the axis of the solid-state laser rod 2.

(b) Semiconductor Laser Light Focusing Component

The semiconductor laser light focusing component 6 is intended to focus all rays of semiconductor laser light emitted out of the stack-type semiconductor laser 5 for the purpose of increasing the output power of the solid-state laser rod. In addition, there is a need to reduce the transverse size of the semiconductor laser light beam at the focal point of the semiconductor laser light focusing component 6 in order to force all rays of the semiconductor laser light into the semiconductor laser light guiding component 7 whose size is reduced so as to reduce the amount of semiconductor laser light that will escape from the interior of the diffusive reflection tube 4.

To that end, according to the first embodiment of the present invention, the semiconductor laser light focusing component 6 is constructed of the cylindrical lens array 6a and the aspherical lens 6b. In the cylindrical lens array 6a, the plurality of cylindrical lenses 6-1 to 6-5 are aligned and integrated in the same direction as the plurality of bar-shaped components 5-1 to 5-5 stacked (i.e., in a direction parallel to the axis of the solid-state laser rod 2 or the direction of the fast axis), and at the same intervals as the plurality of bar-shaped components 5-1 to 5-5 stacked of the stack-type semiconductor laser. Each of the plurality of cylindrical lenses 6-1 to 6-5 of the cylindrical lens array 6a is opposite to a corresponding one of the plurality of bar-shaped components 5-1 to 5-5 of the stack-type semiconductor laser 5 and is located at substantially its focal distance from the light-emitting end portion of the corresponding bar-shaped component. The aspherical lens 6b can refract an incident ray of light with respect to a direction parallel to the direction in which the plurality of bar-shaped components 6-1 to 6-5 are stacked, as shown in FIG. 1(B). The aspherical lens 6b is located between the cylindrical lens array 6a and the semiconductor laser light guiding component 7, and at substantially its focal distance from an end portion of the semiconductor laser light guiding component 7.

When the semiconductor laser light focusing component 6 is constructed as above, each of the plurality of cylindrical lenses 6-1 to 6-5 can collimate the incident laser light emitted out of the corresponding bar-shaped component opposite to each of the plurality of cylindrical lenses 6-1 to 6-5. The aspherical lens 6b then focuses all rays of the semiconductor laser light thus collimated by the cylindrical lens array 6a comprised of the plurality of cylindrical lenses 6-1 to 6-5 to a linear cross section whose shorter side is running in a direction parallel to the direction in which the plurality of bar-shaped components 5-1 to 5-5 are stacked, i.e., in a direction parallel to the axis of the solid-state laser rod 2. The length of the shorter side of the linear cross section of the laser beam, running in a direction parallel to the direction in which the plurality of bar-shaped components 5-1 to 5-5 are stacked (i.e., in the direction of the fast axis), which will be referred to as the transverse size of the semiconductor laser light beam at the focal point of the focusing component 6, can be theoretically calculated using $d2*f/f3$, where d2 is the transverse size of the semiconductor laser light beam at the light-emitting end portion of each bar-shaped component of the stack-type semiconductor laser, f3 is the focal length of each of the plurality of cylindrical lenses 6-1 to 6-5 of the cylindrical lens array 6a, and f is the focal length of the aspherical lens 6b. For example, the transverse size of the semiconductor laser light beam at the focal point of the aspherical lens can be as small as a few microns.

In this case, each semiconductor laser beam can have a cross section whose one side is running in a direction parallel to the direction in which the plurality of bar-shaped components 5-1 to 5-5 are stacked (i.e., in the direction of the fast axis) is 10 to 20 millimeters long, for example, immediately after passing through each of the plurality of cylindrical lenses of the cylindrical lens array 6a. Therefore, if a general focusing lens is used to focus the semiconductor laser light incident from the cylindrical lens array 6a, spherical aberration would occur and the linear cross section of the focused semiconductor laser light would become blurred greatly. On the contrary, according to the present invention, the aspherical lens 6b is used as the focusing lens to reduce the spherical aberration to a lower level and reduce the transverse size of the semiconductor laser light beam at the focal point of the aspherical lens 6b.

If any one of the plurality of bar-shaped components 5-1 to 5-5 is out of place, the corresponding cylindrical lens opposite to the bar-shaped component out of place can refract laser light incident thereon from the bar-shaped component out of place at an angle with respect to the direction in which it should travel when collimating the incident laser light. For example, FIG. 2 shows the case that the bar-shaped component 5-1 is out of place by a distance $\Delta p$, that is, the case that although the predetermined interval to be set between any two neighboring bar-shaped components is p, the interval between the bar-shaped component 5-1 and its neighbor 5-2 is $(p+\Delta p)$. As shown in FIG. 2, the corresponding cylindrical lens 6-1 opposite to the bar-shaped component 5-1 refracts the semiconductor laser light incident from the bar-shaped component 5-1 at an angle $\theta 1$ (measured in radians) with respect to the direction in which it should travel. In this case, the aspherical lens 6b focuses the semiconductor laser light that has deviated from the original path by the angle $\theta 1$ at a position that deviates from the predetermined focal point O by $(f*\theta 1)$ in a direction parallel to the direction in which the plurality of bar-shaped components 5-1 to 5-5 are stacked (i.e., in the direction of the fast axis), where f is the focal length of the aspherical lens 6b.

In order to reduce the amount of deviation of the position to which the laser light incident from one bar-shaped component out of place is focused from the predetermined focal point O, as well as to reduce the transverse size of the semiconductor laser light beam at the focal point of the aspherical lens, it is preferable to reduce the focal length f of the aspherical lens 6b. However, rays of the semiconductor laser light that pass through part of the aspherical lens 6b which is apart from its center have coma aberration and therefore the linear cross section of the semiconductor laser light at the focal point of the aspherical lens becomes blurred greatly. FIG. 3(B) shows a graph showing the transverse size of the semiconductor laser light beam at the focal point of the aspherical lens 6b, plotted as a function of the focal length f of the aspherical lens 6b normalized with L, which is focused by the aspherical lens 6b after it has passed through the cylindrical lens array 6a. In the figure, the horizontal axis shows the focal length f of the aspherical lens 6b normalized with the length L of one side of the cross section of the semiconductor laser light emerging from the cylindrical lens array 6a, the side running in a direction parallel to the direction in which the plurality of bar-shaped components 5-1 to 5-5 are stacked (i.e., in a direction parallel to the axis of the solid-state laser rod 2 or the direction of the fast axis), as shown in FIG. 3(A), and the vertical axis shows the transverse size of (or the length of the shorter side of a cross section) of the semiconductor laser light beam at the focal point of the aspherical lens 6b, which can be obtained assuming that the semiconductor laser light emerging from the cylindrical lens array 6a has a divergence angle of $\pm\theta$ with respect to the direction in which it travels, with respect to the direction in which the plurality of bar-shaped components 5-1 to 5-5 are stacked. The graph of FIG. 3(B) results from calculation carried out under condition that the aspherical shape of the aspherical lens 6b is determined so that the transverse size of the semiconductor laser light beam focused at the focal point of the aspherical lens is minimized. In FIG. 3(B), the curve a shows the case that coma aberration occurs, whereas the curve b shows the case that coma aberration does not occur. As shown in FIG. 3(B), in the case that no coma aberration occurs, the transverse size of the semiconductor laser light beam focused at the focal point of the aspherical lens decreases with a decrease in the focal length f of the aspherical lens 6b. On the other hand, in the case that coma aberration occurs, the transverse size of the semiconductor laser light beam focused at the focal point of the aspherical lens is reduced to its minimum when the focal length f of the aspherical lens 6b normalized with L is 0.7, and increases dramatically when the focal length f of the aspherical lens 6b normalized with L is equal to or less than 0.5. It is therefore desirable to set the focal length f of the aspherical lens 6b normalized with L to 0.5 or more, that is, to set the focal length f of the aspherical lens 6b to $(0.5*L)$ or more, in order to reduce the transverse size of the semiconductor laser light beam focused at the focal point of the aspherical lens, as can be seen from FIG. 3(B).

Figure 4:
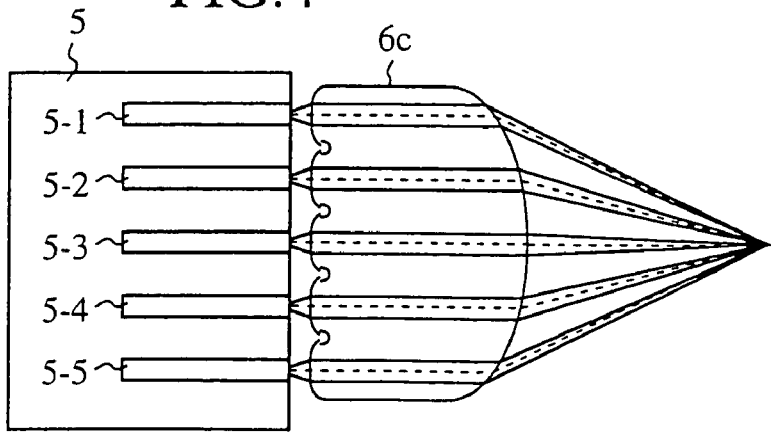
FIG. 4 is a cross-sectional view showing an aspherical composite lens for use in the solid-state laser rod pumping module according to the first embodiment of the present invention.

If both the cylindrical lens array 6a and the aspherical lens 6b rotate about the line A–A' as shown in FIG. 1(A) from their predetermined positions where they are arranged in parallel to each other, there causes a displacement of the focal point of the aspherical lens 6b, to which the semiconductor laser light is focused, between any two points apart from each other in the direction X perpendicular to the axis of the solid-state laser rod 2. The displacement is a one in the direction Y parallel to the direction in which the plurality of bar-shaped components 5-1 to 5-5 are stacked. As a result, the linear cross section of the semiconductor laser light focused onto the input surface of the semiconductor laser light guiding component 7 becomes blurred. For example, when the angle of the rotation of both the cylindrical lens array 6a and the aspherical lens 6b is 1 degree, there causes a 170 μm displacement of the focal point of the aspherical lens 6b, to which the semiconductor laser light is focused, between any two points that are at a distance of 10 mm from each other. It is therefore preferable to use an aspherical composite lens 6c, as shown in FIG. 4, into which the cylindrical lens array and the aspherical lens are integrated, in order to reduce such a displacement of the focal point of the semiconductor laser light focusing component 6 to which the semiconductor laser light is focused. The use of the aspherical composite lens 6c can reduce a possible amount of rotational displacement thereof about the line A–A' of FIG. 1(A) to 0.1 degrees or less.

Preferably, the aspherical lens 6b can be so constructed as to also refract incident laser light with respect to a direction orthogonal to the direction in which the plurality of bar-shaped components 5-1 to 5-5 are stacked (i.e., in the direction of the slow axis). In this case, the aspherical lens 6b can refract and focus all rays of the semiconductor laser light collimated by the plurality of cylindrical lenses 6-1 to 6-5 to a small cross section with respect to a direction orthogonal to the direction in which the plurality of bar-shaped components 5-1 to 5-5 are stacked, as well as with respect to a direction parallel to the direction in which the plurality of bar-shaped components 5-1 to 5-5 are stacked. It is therefore preferable to use the aspherical lens 6b of this variant, in order to reduce the dimensions of the semiconductor laser light guiding component 7 and hence reduce the amount of semiconductor laser light that can escape from the interior of the diffusive reflection tube 4, thereby making it possible to pump the solid-state laser rod 2 with a high degree of efficiency.

2. Semiconductor Laser Light Guiding Component

The semiconductor laser light guiding component 7 is intended to guide the semiconductor laser light focused and injected thereinto by the semiconductor laser light focusing component 6 to one end portion thereof while substantially maintaining the length of a shorter side of a cross section of the semiconductor laser light passing therethrough, which is running in a direction parallel to the direction in which the plurality of bar-shaped components 5-1 to 5-5 are stacked (i.e., in the direction of the fast axis), and for further guiding the semiconductor laser light toward the solid-state laser rod 2 placed within the diffusive reflection tube 4, so as to pump the solid-state laser rod 2 with a high degree of efficiency.

The length of the shorter side of the cross section of the semiconductor laser light emerging from the aspherical lens 6b, the shorter side running in a direction parallel to the direction in which the plurality of bar-shaped components 5-1 to 5-5 are stacked (or in the direction of the fast axis), i.e., in a direction parallel to the axis of the solid-state laser rod 2, is reduced to a minimum at the focal point of the aspherical lens 6b, but is increased divergently (or abruptly) before and after the focal point. On the other hand, when the diffusive reflection tube 4 is made of a ceramic material or a polymer material, which is in widespread use as a material for diffusive reflection tubes, the reflectivity of the diffusive reflection tube 4 largely depends on its thickness. For example, when forming the diffusive reflection tube 4 with 98% or more reflectivity using a ceramic material, the diffusive reflection tube 4 should have a thickness of about 10 mm.

Therefore, in the case of constructing the semiconductor laser light guiding component 7 using the slit 11 formed in the diffusive reflection tube 4 only, as shown in FIG. 5, there is a need to increase the length of one side of the slit 11 which is running in a direction parallel to the direction in which the plurality of bar-shaped components 5-1 to 5-5 are stacked (i.e., in a direction parallel to the axis of the solid-state laser rod 2 or the direction of the fast axis). For example, when the thickness of the diffusive reflection tube 4 is 10 millimeters, the length L of one side of a cross section of the semiconductor laser light emerging from the cylindrical lens array 6a, which is running in a direction parallel to the direction in which the plurality of bar-shaped components 5-1 to 5-5 are stacked, is 10 millimeters, and the focal length of the aspherical lens 6b is 7 millimeters, the semiconductor laser light can have a divergence angle of 70 degrees before and after the focal point of the aspherical lens 6b. As a result, the length of one side of a cross section of the focused semiconductor laser light that is running in a direction parallel to the direction in which the plurality of bar-shaped components 5-1 to 5-5 are stacked can reach 7 millimeters at both openings of the slit 11. This can reduce the capability of trapping the semiconductor laser light within the interior of the diffusive reflection tube 4. It can be understood from the above description that the semiconductor laser light guiding component 7 needs to maintain the length of the shorter side of the linear cross section of the focused semiconductor laser light that is running in a direction parallel to the direction in which the plurality of bar-shaped components 5-1 to 5-5 are stacked so as to guide the semiconductor laser light to the interior of the diffusive reflection tube 4.

As shown in FIGS. 6(A) and 6(B), in accordance with the first embodiment of the present invention, the semiconductor laser light guiding component 7 is comprised of the slit 11 formed in the diffusive reflection tube 4, a hexahedron-shaped slab wave guide 12 located within the slit 11, and an adhesive layer 13 formed in space between four faces of the slab wave guide 12 other than a first face 12a via which the semiconductor laser light is incident on the slab wave guide 12 and a second face 12b via which the semiconductor laser light emerges from the slab wave guide 12, and the slit 11. The adhesive layer 13 has lower refractive index than the slab wave guide 12. FIG. 6(B) is a cross-sectional view taken along the line B–B' of FIG. 6(A).

In the semiconductor laser light guiding component 7 constructed as above, the semiconductor laser light linearly focused at the focal point 0 enters the slab wave guide 12 by way of the first face 12a. The semiconductor laser light incident on the slab wave guide 12 is totally, repeatedly reflected off the boundaries between the adhesive layer 13 having lower refractive index than the slab wave guide 12 and the slab wave guide 12, and then emerges from the second face 12b. The semiconductor laser light is then injected into the interior of the diffusive reflection tube 4.

In the stack-type semiconductor laser 5 according to the present invention, since the plurality of bar-shaped components are stacked in a direction parallel to the axis of the solid-state laser rod 2 (i.e., in the direction of the fast axis), and a plurality of laser-light-emitting end portions are aligned and integrated in a direction orthogonal to the axis of the solid-state laser rod 2 in each of the plurality of bar-shaped components, the semiconductor laser light emitted out of the stack-type semiconductor laser has a large divergence angle with respect to a direction parallel to (or including) the axis of the solid-state laser rod 2. As a result, with respect to a longitudinal section of the semiconductor laser light parallel to (or including) the axis of the solid-state laser rod 2, the ratio of the amount of light that is incident on part of the solid-state laser rod 2, which is opposite to the second face 12b of the slab wave guide 12, first to the total amount of semiconductor laser light emerging from the slab wave guide 12 toward the solid-state laser rod 2 is much less than that in a case that the stack-type semiconductor laser 5 is placed that its fast axis is parallel to the axis of the solid-state laser rod 2 and hence its slow axis is perpendicular to the axis of the solid-state laser rod 2, as shown in FIG. 6(B). Also, by making the length W of one side of the second face 12b running in a direction orthogonal to the axis of the solid-state laser rod 2 greater than the diameter R of the solid-state laser rod 2, as shown in FIG. 6(A), the ratio of the amount of light that is incident on part of the solid-state laser rod 2, which is opposite to the second face 12b of the slab wave guide 12, first to the total amount of semiconductor laser light emerging from the slab wave guide 12 toward the solid-state laser rod 2 can be reduced with respect to a longitudinal section of the semiconductor laser light perpendicular to the axis of the solid-state laser rod 2.

Figure 7:
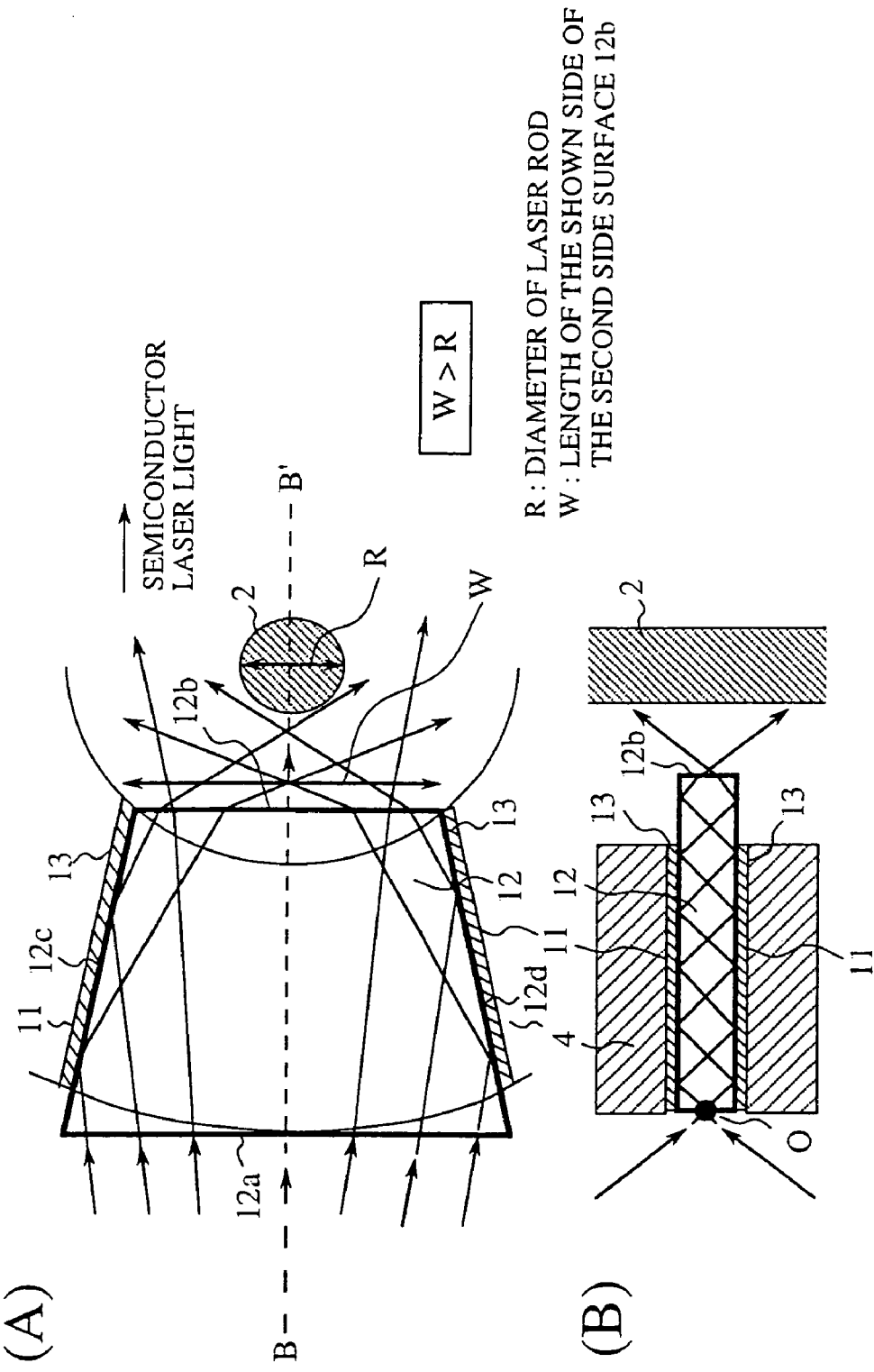
FIG. 7(A) is a cross-sectional view showing the structure of another example of the semiconductor laser light component for use in the solid-state laser rod pumping module according to the first embodiment of the present invention.
FIG. 7(B) is a cross-sectional view taken along the line B–B' of FIG. 7(A)

The slab wave guide 12 can be shaped like a rectangular parallelepiped, as shown in FIGS. 6(A) and 6(B). As an alternative, it is preferable that the first face 12a of the slab wave guide 12 has a smaller area than the second face 12b, as shown in FIGS. 7(A) and 7(B), so as to reduce the amount of semiconductor laser light that can escape from the semiconductor laser light guiding component 7, thereby making it possible to pump the solid-state laser rod 2 with a higher degree of efficiency. In addition, by making the length W of the side of the second face 12b running in a direction orthogonal to the axis of the solid-state laser rod 2 greater than the diameter R of the solid-state laser rod 2, the ratio of the amount of semiconductor laser light that is incident on the solid-state laser rod 2 first to the total amount of semiconductor laser light emerging from the second face 12b of the slab wave guide can be further reduced. Thereby, the nonuniform intensity distribution of pumping light within the solid-state laser rod 2 can be resolved, and therefore the solid-state laser rod 2 can be pumped with high power and with a high degree of efficiency, thus providing laser light having a high beam quality. Further, it is desirable to increase the refractive index of the slab wave guide 12 to a maximum, thereby reducing the critical angle defined as the total reflection condition to a minimum. FIG. 7(B) is a cross-sectional view taken along the line B–B' of FIG. 7(A).

Figure 8:
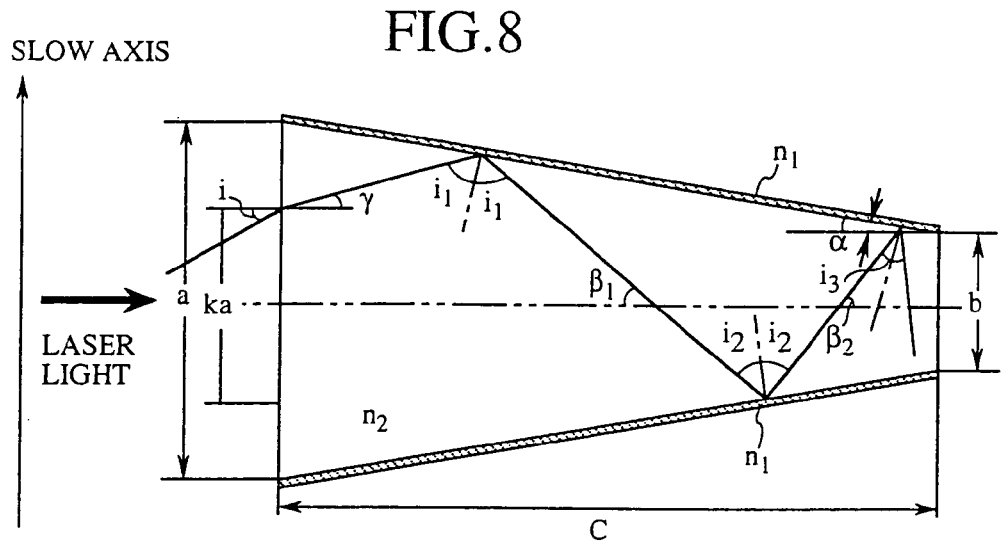
FIG. 8 is a cross-sectional view showing reflections of a ray of semiconductor laser light incident upon a slab wave guide.

It is necessary to determine the areas of the first and second faces 12a and 12b in consideration of the fact that when the area of the second face 12b is reduced to be much less than that of the first face 12a, the angle of incidence of the semiconductor laser light with respect to the other faces 12c and 12d becomes lower and hence there is a possibility that the total reflection condition is not satisfied. In FIG. 8, assume that a is the length of one side of the first face 12a, upon which semiconductor laser light is incident, running in the direction of the slow axis, b is the length of one side of the first face 12a, via which the semiconductor laser light emerges from the slab wave guide, running in the direction of the slow axis, c is the longitudinal length of the slab wave guide 12 running in a direction orthogonal to the slow and fast axes, and $\alpha$ ($=\tan[(a-b)/2c]$) is the angle of inclination of the third and fourth faces 12c and 12d with respect to the longitudinal axis of the slab wave guide 12. In addition, assume that the semiconductor laser light incident on the slab wave guide 12 has a transverse size ka at the first face 12a of the slab wave guide 12, and a divergence angle 2i. If it is assumed that the semiconductor laser light is reflected off the third and fourth faces 12c and 12d within the slab wave guide 12 a number of times n, the angle of incidence $i_n$ (n=1,2, . . . ) of the semiconductor laser light, which will be reflected off the third or fourth face 12c or 12d for an n-th time, is given by the following equation (1), and the angle $\beta_n$ (n=1,2, . . . ) between the path of the semiconductor laser light, which has been reflected off the third or fourth face 12c or 12d for an n-th time, and the longitudinal axis of the slab wave guide 12 is given by the following equation (2).

$$\begin{cases} i_1 = 90 - \alpha - r \\ i_2 = 90 - 3\alpha - r \\ i_3 = 90 - 5\alpha - r \\ \ldots \end{cases} \Rightarrow i_n = 90 - (2n-1)\cdot\alpha - r \quad (1)$$

$$\begin{cases} \beta_1 = 2\cdot\alpha + r \\ \beta_2 = 4\cdot\alpha + r \\ \ldots \end{cases} \Rightarrow \beta_n = 2\cdot n\cdot\alpha + r \quad (2)$$

where $n_1$ is the refractive index of the adhesive layer 13, $n_2$ is the refractive index of the slab wave guide 12, and $\gamma$ is the angle of refraction of the semiconductor laser light entering the slab wave guide 12. When total internal reflection is needed for every reflection at the boundary between the adhesive layer 13 and the slab wave guide 12 when the semiconductor laser light is incident upon the interior of the slab wave guide 12, the number of times that the semiconductor laser light can be reflected off the boundary is given by the following equation (3). Also, a requirement that all the semiconductor laser light incident on the slab wave guide 12 has to emerge from the slab wave guide 12 restricts the number of times that the semiconductor laser light can be reflected off the boundary, as shown in the following equation (4).

$$i_n > \arcsin(n_1/n_2) \Rightarrow n < \frac{90° - r + \alpha - \arcsin(n_1/n_2)}{2\cdot\alpha} \quad (3)$$

$$\beta_n < \arcsin(1/n_2) \Rightarrow n < \frac{\arcsin(1/n_2) - r}{2\cdot\alpha} \quad (4)$$

Figure 9A:
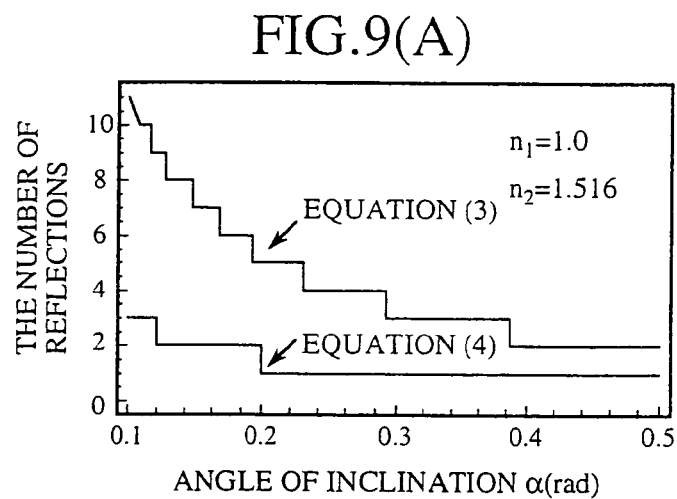
FIG. 9(A) is a graph showing a relationship between the angle α of inclination of faces of the slab wave guide with respect to the longitudinal axis of the slab wave guide and the number of times that the semiconductor laser light incident upon the wave guide can be reflected off the faces when the semiconductor laser light has a divergence angle of 10 degrees with respect to a direction of a slow axis and the slab wave guide is made of BK7 with refractive index of 1.516.

Referring next to FIG. 9(A), there is illustrated a graph showing a relationship between the angle $\alpha$ of inclination of the third and fourth faces of the slab wave guide 12 with respect to the longitudinal axis of the slab wave guide 12 and the number of times that the semiconductor laser light can be reflected off the third and fourth faces within the slab wave guide 12, which can be obtained using the above equations (3) and (4), when the semiconductor laser light has a divergence angle of 10 degrees with respect to the direction of the slow axis and the slab wave guide 12 is made of BK7 with index $n_2$=1.516. Also, FIG. 9(B) is a graph showing a relationship between the angle $\alpha$ of inclination of the third and fourth faces of the slab wave guide 12 with respect to the longitudinal axis of the slab wave guide 12 and the number of times that the semiconductor laser light can be reflected off the third and fourth faces within the slab wave guide 12, which can be obtained using the above equations (3) and (4), when the semiconductor laser light has a divergence angle of 10 degrees with respect to the direction of the slow axis and the slab wave guide 12 is made of YAG with index $n_2$=1.82.

Figure 9B:
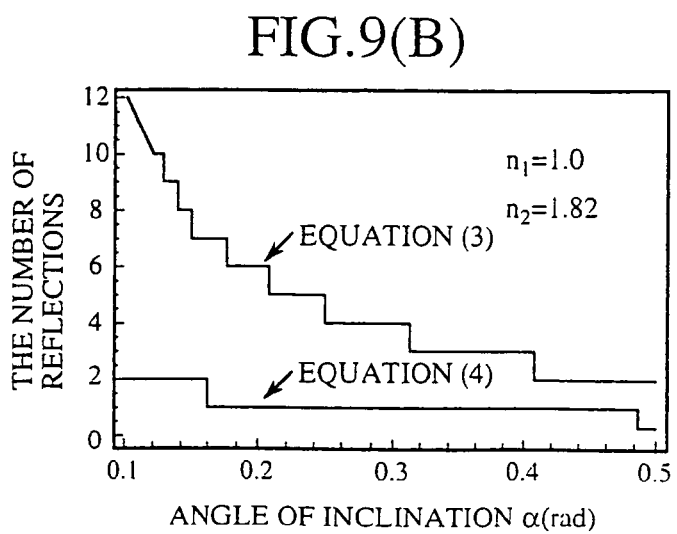
FIG. 9(B) is a graph showing a relationship between the angle α of inclination of the faces of the slab wave guide with respect to the longitudinal axis of the slab wave guide and the number of times that the semiconductor laser light can be reflected off the faces within the slab wave guide when the semiconductor laser light has a divergence angle of 10 degrees with respect to the direction of the slow axis and the slab wave guide is made of YAG with index of 1.82.

As shown in FIGS. 9(A) and 9(B), the above conditions given by the equations (3) and (4) require the semiconductor laser light incident upon the slab wave guide 12 to emerge from the slab wave guide after it has been reflected off at most once in a plane including the longitudinal axis of the slab wave guide, the plane being orthogonal to the fast axis, that is, after it has been reflected off the third or fourth face 12c or 12d of the slab wave guide 12 of FIG. 7(A) at most once, in order to increase the angle α of inclination of the third and fourth faces with respect to the longitudinal axis of the slab wave guide 12 and to reduce the longitudinal length of the slab wave guide 12 running in a direction orthogonal to the slow and fast axes of the semiconductor laser. Further, an increase in the refractive index $n_2$ of the slab wave guide 12 can increase the angle α of inclination of the third and fourth faces with respect to the longitudinal axis of the slab wave guide 12, thus reducing the area of the second face 12b of the slab wave guide 12 as compared with that of the first face 12a and hence reducing the amount of semiconductor laser light that escapes from the semiconductor laser light guiding component 7, and being able to pump the solid-state laser rod 2 with a high degree of efficiency.

3. Semiconductor Laser Light Diffusing Component

All rays of the semiconductor laser light entering the interior of the diffusive reflection tube 4 diverges largely with respect to a direction parallel to the axis of the solid-state laser rod 2 (i.e., the direction of the fast axis), as shown in FIG. 6(B). The ratio of the amount of semiconductor laser light incident on the solid-state laser rod 2 first to the total amount of semiconductor laser light emerging from the semiconductor laser light guiding component is therefore small. On the other hand, the semiconductor laser light emitted out of the stack-type semiconductor laser 5 has a small divergence angle with respect to a direction orthogonal to the axis of the solid-state laser rod 2 (i.e., the direction of the slow axis). Therefore, by making the area of the first face 12a greater than that of the second face 12b and making the length W of the side of the second face 12b running in a direction orthogonal to the axis of the solid-state laser rod 2 greater than the diameter R of the solid-state laser rod 2, as shown in FIG. 6(A), the ratio of the amount of semiconductor laser light incident on the solid-state laser rod 2 first to the total amount of semiconductor laser light emerging from the semiconductor laser light guiding component 7 can be reduced with respect to a longitudinal section of the semiconductor laser light orthogonal to the axis of the solid-state laser rod 2. However, those measures cannot resolve the nonuniform distribution of the optical pumping light intensity within the solid-state laser rod 2 perfectly.

Figure 10:
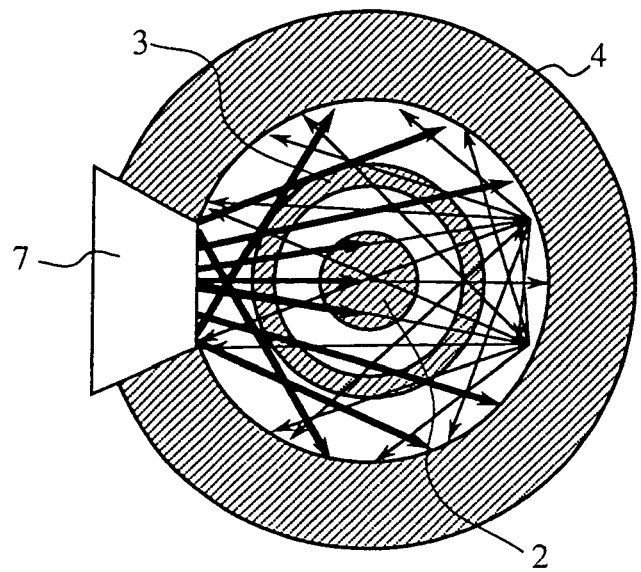
FIG. 10 is a cross-sectional view showing the propagation of rays of semiconductor laser light entering the interior of a diffusive reflection tube when no semiconductor laser light diffusing component is provided, for an explanation of a disadvantage of this configuration.

Referring next to FIG. 10, there is illustrated a schematic diagram showing the propagation of rays of semiconductor laser light entering the interior of the diffusive reflection tube 4. As shown in FIG. 10, some rays of the semiconductor laser light emerging from the semiconductor laser light guiding component 7 pass through the transparent cooling sleeve 3 and then enter part of the solid-state laser rod 2 opposite to the semiconductor laser light guiding component 7 while maintaining their high light intensity, because of their directivity. After that, those rays of the semiconductor laser light are partially absorbed by the solid-state laser rod 2, and the remainder of the semiconductor laser light with low light intensity is diffusively reflected off the diffusive reflection tube 4. In the meantime, the laser light's directivity is reduced and the light intensity is also reduced. The semiconductor laser light is then incident on the solid-state laser rod 2 again. The distribution of the intensity of the semiconductor laser light diffusively reflected off the diffusive reflection tube 4 is made uniform within the tube. As a result, all rays of the semiconductor laser light reflected off the diffusive reflection tube 4 substantially shaped like a cylinder can illuminate the solid-state laser rod 2 uniformly. However, since the light intensity of the illumination by the diffusively-reflected laser light is relatively small, the laser light intensity distribution within the solid-state laser rod 2 has a peak in the vicinity of the part of the laser rod 2 facing the semiconductor laser light guiding component 7; that is, the laser light intensity is not distributed uniformly within the solid-state laser rod 2.

To solve the problem, it is effective to reduce the directivity of the semiconductor laser light emerging from the semiconductor laser light guiding component 7 before the semiconductor laser light enters the solid-state laser rod 2. The semiconductor laser light diffusing component 8 is thus provided between the semiconductor laser light guiding component 7 and the solid-state laser rod 2 so as to cause the semiconductor laser light guided by the semiconductor laser light guiding component 7 to diffuse, as shown in FIG. 11.

Although the semiconductor laser light diffusing component 8 can be constructed of a transparent optical material formed like a ground glass, which surrounds the solid-state laser rod 2, according to the first embodiment of the present invention, the cooling sleeve's inner and outer surfaces are ground, as a ground rough, like a ground glass, which serves as the semiconductor laser light diffusing component 8. It is preferable to set the surface roughness of the ground rough, which depends on the refractive index of the cooling sleeve 3, to a value in a range of a few times to ten times as large as the wavelength of the semiconductor laser light, that is, a value in a range of a few microns to 10 microns. Although available methods of forming a ground rough include a mechanical polishing method and a chemical processing method, it is desirable to use the chemical processing method because the use of the method makes it possible to prevent production of cracks in the cooling sleeve 3. Given the same surface roughness of either the inner surface or the outer surface of the cooling sleeve, the larger the difference between the refractive index of the cooling sleeve 3 and the refractive index of either the coolant or the air between the diffusive reflection tube and the cooling sleeve 3, the higher capability of diffusing laser light the semiconductor laser light diffusing component 8 has. It is therefore desirable that the semiconductor laser light diffusing component 8 is made of a material of larger refractive index. It is further desirable that the cooling sleeve 3 has a small thickness and a large mechanical strength. Therefore the cooling sleeve 3 whose inner and outer surfaces also serve as the semiconductor laser light diffusing component 8 is preferably made of sapphire whose surface is ground or rough like a ground glass.

Figure 11:
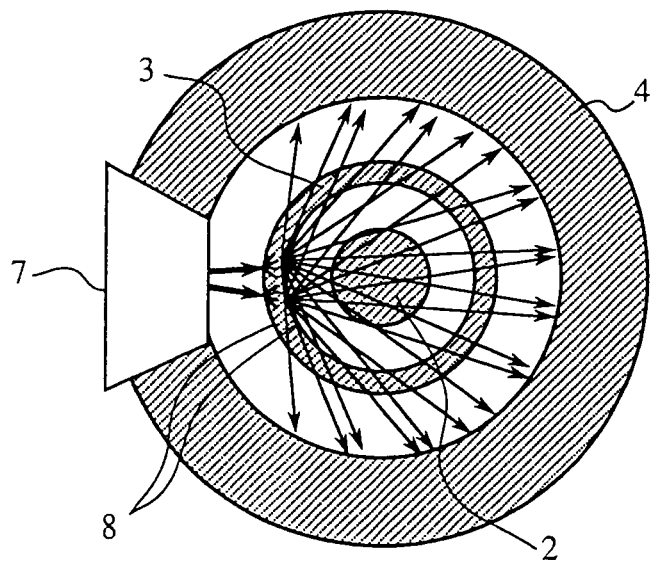
FIG. 11 is a cross-sectional view showing the operation of the semiconductor laser light diffusing component for use in the solid-state laser rod pumping module according to the first embodiment of the present invention.

The semiconductor laser light diffusing component 8 constructed as above and formed on the inner and outer surfaces of the cooling sleeve 3 can diffuse the directive semiconductor laser light with high intensity guided into the interior of the diffusive reflection tube 4, as shown in FIG. 11. In FIG. 11, arrows indicate such the diffusion of the semiconductor laser light. The light intensity of the diffused semiconductor laser light is distributed uniformly within the diffusive reflection tube 4. Some rays of the diffused semiconductor laser light then enter the solid-state laser rod 2 and are partially, repeatedly absorbed by the solid-state laser rod 2. The laser light intensity distribution of the semiconductor laser light within the solid-state laser rod 2 thus becomes axisymmetric with respect to the axis of the solid-state laser rod 2 and uniform. As a result, the radial distribution of temperature in the solid-state laser rod 2 becomes a second-order axisymmetric one, and hence the solid-state laser rod 2 becomes a grated refractive index lens with no wave aberration, thereby making it possible to cause the solid-state laser rod 2 to generate laser light with a high beam quality.

In a variant, the cooling sleeve 3 can also serve as the semiconductor laser light diffusing component 8. The cooling sleeve 3 can be made of a foaming glass including bubbles having diameters that are a few times to ten times as large as the wavelength of the semiconductor laser light, that is, in a range of a few microns to 10 microns. The semiconductor laser light diffusing component 8 of this variant has a higher capability of diffusing incident laser light as compared with the above-mentioned case that the inner and outer surfaces of the cooling sleeve 3 are formed as a ground rough.

In operation, laser light emitted out of each of the plurality of bar-shaped components 5-1 to 5-5 can be collimated by each of the plurality of cylindrical lenses 6-1 to 6-5 opposite to each of the plurality of bar-shaped components 5-1 to 5-5. Each ray of the semiconductor laser light collimated by the cylindrical lens array is then refracted in a direction parallel to the direction in which the plurality of bar-shaped components 5-1 to 5-5 are stacked (i.e., in a direction parallel to the axis of the solid-state laser rod 2 or the direction of the fast axis) by the aspherical lens 6b, and is focused to a linear cross section having a longer side running in a direction perpendicular to the direction in which the plurality of bar-shaped components 5-1 to 5-5 are stacked. The linearly converging semiconductor laser light then enters the slab wave guide 12 by way of the first face 12a of the slab wave guide. The semiconductor laser light incident on the slab wave guide 12 is totally, repeatedly reflected off the faces of the slab wave guide 12 other than the first and second faces 12a and 12b, and then emerges from the second face 12b and is guided toward the interior of the diffusive reflection tube 4.

The laser light emitted out of each of the plurality of bar-shaped components. 5-1 to 5-5 has a divergence angle of about 10 degrees with respect to a direction orthogonal to the axis of the solid-state laser rod 2 (i.e., the direction of the slow axis), and a divergence angle of about 30 degrees with respect to a direction parallel to the axis of the solid-state laser rod 2 (i.e., the direction of the fast axis). Since all rays of the semiconductor laser light entering the interior of the diffusive reflection tube 4 diverges largely with respect to a direction parallel to the axis of the solid-state laser rod 2, as shown in FIG. 1(B), the ratio of the amount of semiconductor laser light incident on part of the solid-state laser rod 2, which is opposite to the output surface of the semiconductor laser light guiding component 7, first to the total amount of semiconductor laser light emerging from the semiconductor laser light guiding component 7 is reduced with respect to a longitudinal section of the semiconductor laser light parallel to the axis of the solid-state laser rod 2. In addition, by making the area of the first face 12a of the slab wave guide 12 greater than that of the second face 12b and making the length W of the side of the second face 12b running in a direction orthogonal to the axis of the solid-state laser rod 2 greater than the diameter R of the solid-state laser rod 2, the ratio of the amount of semiconductor laser light that has a small divergence angle with respect to a direction orthogonal to the axis of the solid-state laser rod 2, and that is incident on the solid-state laser rod 2 first, to the total amount of semiconductor laser light emerging from the semiconductor laser light guiding component 7 can be also reduced with respect to a longitudinal section of the semiconductor laser light perpendicular to the axis of the solid-state laser rod 2, as shown in FIG. 1(A). Further, the semiconductor laser light entering the interior of the diffusive reflection tube is diffused by the semiconductor laser light diffusing component 8 formed on the inner and outer surfaces of the cooling sleeve 3, as shown in FIG. 1(C). The intensity of the semiconductor laser light is thus distributed uniformly within the diffusive reflection tube 4.

As previously explained, in accordance with the first embodiment of the present invention, the solid-state laser rod pumping module 1 is comprised of the solid-state laser rod 2, the cooling sleeve 3, the diffusive reflection tube 4, the semiconductor laser light emitting apparatus 5a that consists of the stack-type semiconductor laser 5 and the semiconductor laser light focusing component 6, the semiconductor laser light guiding component 7, and the semiconductor laser light diffusing component 8. Accordingly, the first embodiment offers the advantage of being able to pump the solid-state laser rod 2 with high power and with a high degree of efficiency, thereby causing the solid-state laser rod 2 to generate laser light with a high beam quality.

Second Embodiment

Figure 12C:
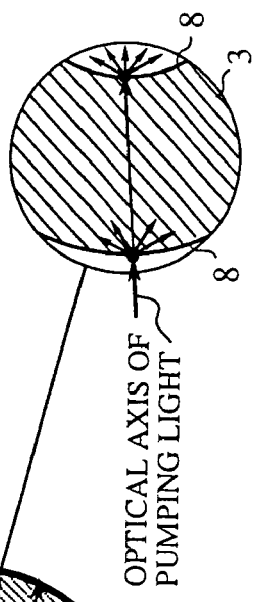
FIG. 12(C) is an enlarged view of a part D of FIG. 1(A)
Figure 12:
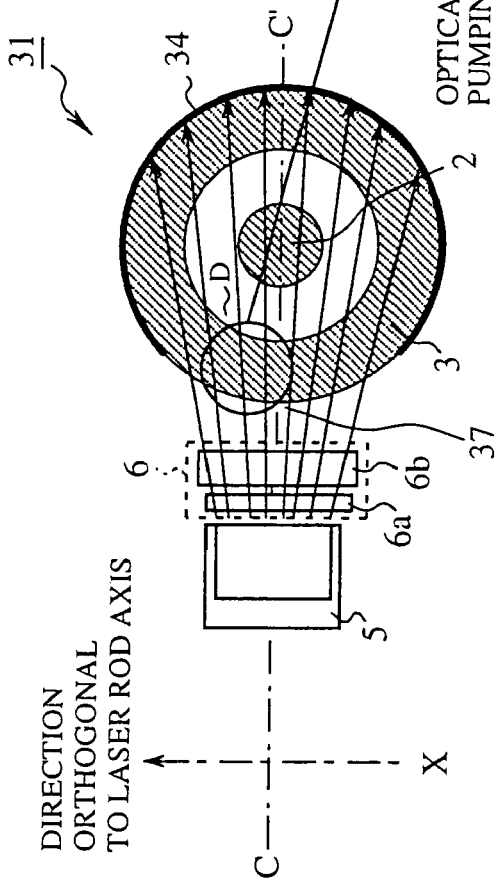
FIG. 12(A) is a cross-sectional view showing the structure of a solid-state laser rod pumping module according to a second embodiment of the present invention.
FIG. 12(B) is a cross-sectional view taken along the line C–C' of FIG. 10(A)
Figure 12:
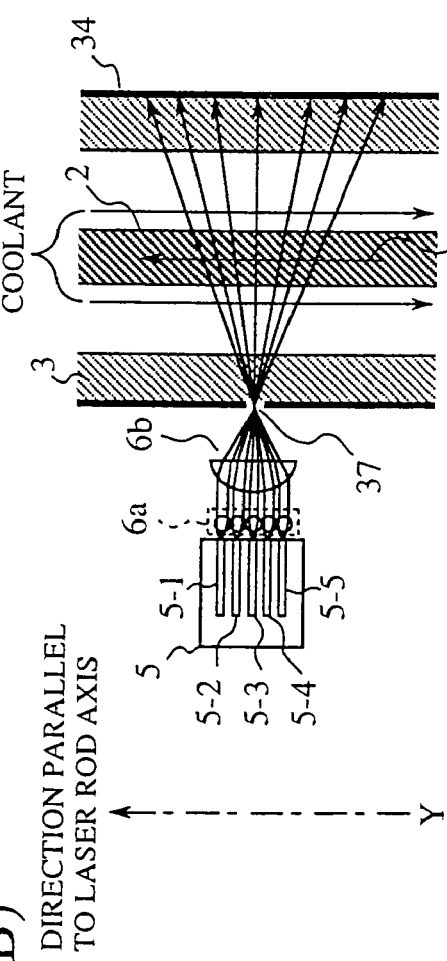

Referring next to FIGS. 12(A), 12(B), and 12(C), there are illustrated respective cross-sectional views showing a solid-state laser rod pumping module according to a second embodiment of the present invention. FIG. 12(A) is a cross-sectional view taken on the plane perpendicular to the axis of the solid-state laser rod 2, FIG. 12(B) is a cross-sectional view taken along the line C–C' of FIG. 12(A), and FIG. 12(C) is an enlarged view of the part D of FIG. 12(A). In the figures, reference numeral 31 denotes a solid-state laser rod pumping module, 34 denotes a mirror-reflective reflection tube that is so constructed as to mirror-reflect semiconductor laser light incident thereon, which is disposed on substantially the same axis as a solid-state laser rod 2 so that it surrounds the solid-state laser rod 2 and a cooling sleeve 3, and 37 denotes a semiconductor laser light focusing component formed in the mirror-reflective reflection tube 34, for guiding semiconductor laser light focused and injected thereinto to an end portion thereof while substantially maintaining the length of one side of a cross section of the semiconductor laser light, which is running in a direction parallel to the direction in which a plurality of bar-shaped components 5-1 to 5-5 of a stack-type semiconductor laser 5 are stacked, and for guiding the laser light toward the solid-state laser rod located within the mirror-reflective reflection tube 34. In the figures, the same reference numerals as shown in FIG. 1 denote the same components as the solid-state laser rod pumping module of the first embodiment mentioned above or like components, and therefore the description of those components will be omitted hereinafter. In FIG. 12(A), the arrow X shows a direction perpendicular to the axis of the solid-state laser rod 2 (i.e., the direction of the slow axis). In FIG. 12(B), the arrow Y shows a direction parallel to the axis of the solid-state laser rod 2 (i.e., the direction of the fast axis). Other arrows are also shown in FIG. 12(B) for indicating the direction in which a coolant flows.

In accordance with the second embodiment of the present invention, the mirror-reflective reflection tube 34 is constructed of a high-reflectivity coating formed on the outer surface of the cooling sleeve 3, and the semiconductor laser light guiding component 37 is constructed of an anti-reflection coating formed, like a slit, on the outer surface of the cooling sleeve 3. The size of the semiconductor laser light guiding component 37 constructed of the anti-reflection coating formed like a slit is reduced to one as small as the transverse size of the focused semiconductor laser light beam at the focal point of the aspherical lens 6b, thereby improving the efficiency of trapping the semiconductor laser light within the mirror-reflective reflection tube 34. The inner and outer surfaces of the cooling sleeve 3 are ground like a ground glass, which serve as the semiconductor laser light diffusing component 8.

In operation, laser light emitted out of each of the plurality of bar-shaped components 5-1 to 5-5 can be collimated by each of the plurality of cylindrical lenses 6-1 to 6-5 opposite to each of the plurality of bar-shaped components 5-1 to 5-5. Each ray of the semiconductor laser light collimated by the cylindrical lens array is then refracted in a direction parallel to the direction in which the five bar-shaped components 5-1 to 5-5 are stacked (i.e., in a direction parallel to the axis of the solid-state laser rod 2 or the direction of the fast axis) by the aspherical lens 6b, and is focused to a linear cross section having a longer side running in a direction perpendicular to the direction in which the plurality of bar-shaped components 5-1 to 5-5 are stacked. The linearly converging semiconductor laser light is then guided toward the interior of the mirror-reflective reflection tube 34 by way of the semiconductor laser light guiding component 37 constructed of the anti-reflection coating located at the focal point of the aspherical lens. The semiconductor laser light entering the interior of the mirror-reflective reflection tube 34 is diffused by the inner and outer surfaces of the cooling sleeve 3. The semiconductor laser light diffusing component 8 formed on the inner and outer surfaces of the cooling sleeve 3 diffuses the semiconductor laser light incident from the semiconductor laser light guiding component 37, as indicated by arrows shown in FIG. 12(C). The intensity of the diffused semiconductor laser light is thus distributed uniformly within the mirror-reflective reflection tube 34. The diffused semiconductor laser light then enters the solid-state laser rod 2 and is absorbed by the solid-state laser rod 2.

As previously explained, in accordance with the second embodiment of the present invention, the solid-state laser rod pumping module 31 is comprised of the solid-state laser rod 2, the cooling sleeve 3, the mirror-reflective reflection tube 34, the semiconductor laser light emitting apparatus 5a that consists of the stack-type semiconductor laser 5 and the semiconductor laser light focusing component 6, the semiconductor laser light guiding component 37, and the semiconductor laser light diffusing component 8. Accordingly, the second embodiment offers the advantage of being able to pump the solid-state laser rod 2 with high power and with a high degree of efficiency, thereby causing the solid-state laser rod 2 to generate laser light with a high beam quality.

Unless the solid-state laser rod pumping module includes the semiconductor laser light diffusing component 8, there is a need to change the focal length of the aspherical lens 6b so that the converging angle of the aspherical lens 6b falls within an angle that is formed by two lines connecting both edges of the solid-state laser rod 2 with the semiconductor laser light guiding component 37 when viewed from the semiconductor laser light guiding component 37 in one plane perpendicular to the axis of the solid-state laser rod 2. This results in making the need for increasing the size of the semiconductor laser light guiding component 37 arise, whereby reducing the efficiency of trapping the semiconductor laser light within the mirror-reflective reflection tube 34.

Third Embodiment

Figure 13:
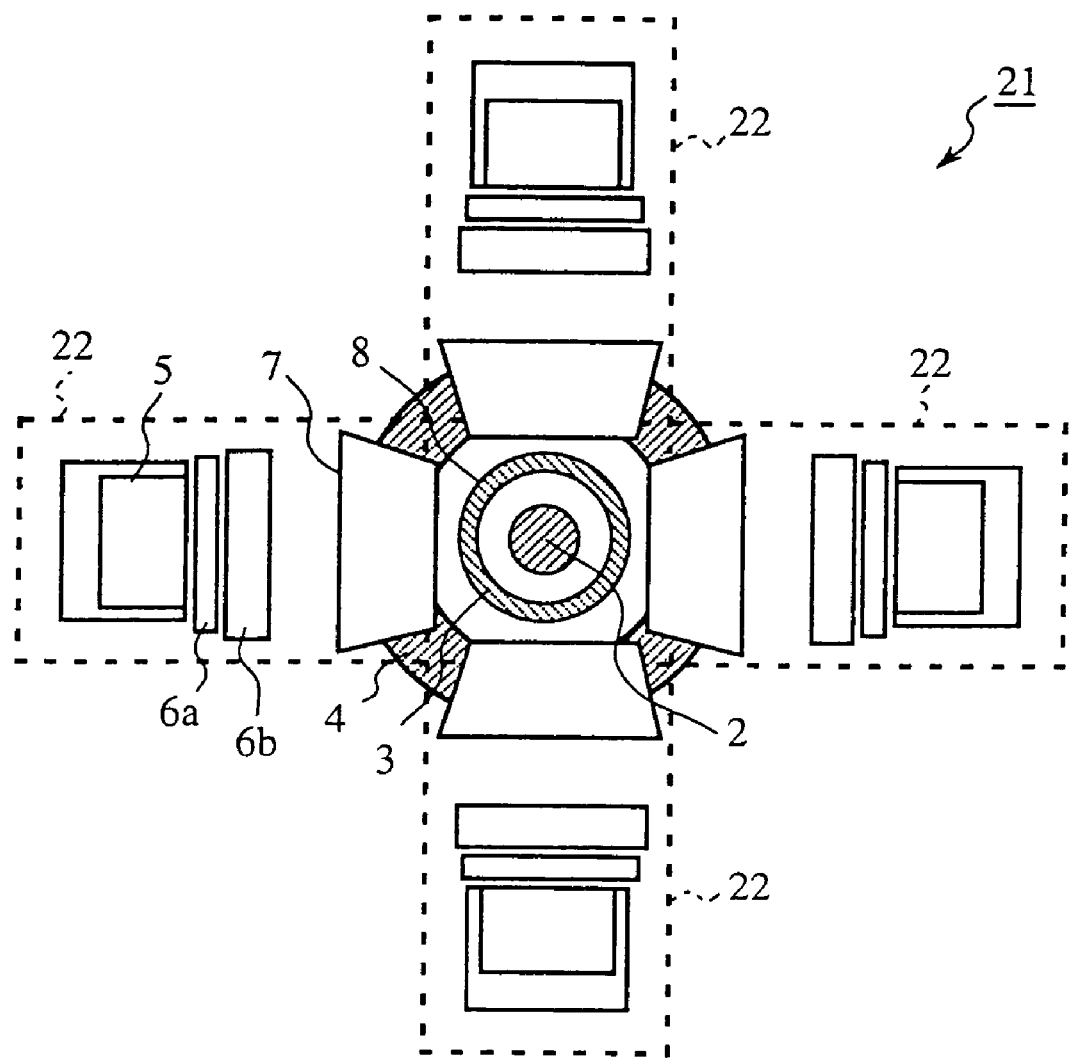
FIG. 13 is a cross-sectional view showing the structure of a solid-state laser rod pumping module according to a third embodiment of the present invention.

In either of the first and second embodiments of the present invention, the solid-state laser rod pumping module comprises only one semiconductor laser light illuminating unit comprised of the stack-type semiconductor laser, the semiconductor laser light focusing component, the semiconductor laser light guiding component, and the semiconductor laser light diffusing component, as previously explained. In contrast, in accordance with a third embodiment of the present invention, there is provided a solid-state laser rod pumping module 21 comprising a plurality of semiconductor laser illuminating units 22 arranged around the solid-state laser rod 2, each of the plurality of semiconductor laser illuminating units 22 having the same structure as that of the first or second embodiment as shown in FIG. 13. The solid-state laser rod pumping module of the third embodiment thus makes it possible to increase the intensity of the semiconductor laser light within the solid-state laser rod 2 and make the intensity distribution axisymmetric with respect to the axis of the solid-state laser rod, thereby causing the solid-state laser rod 2 to generate laser light with higher power and with a higher beam quality.

Fourth Embodiment

Figure 14A:
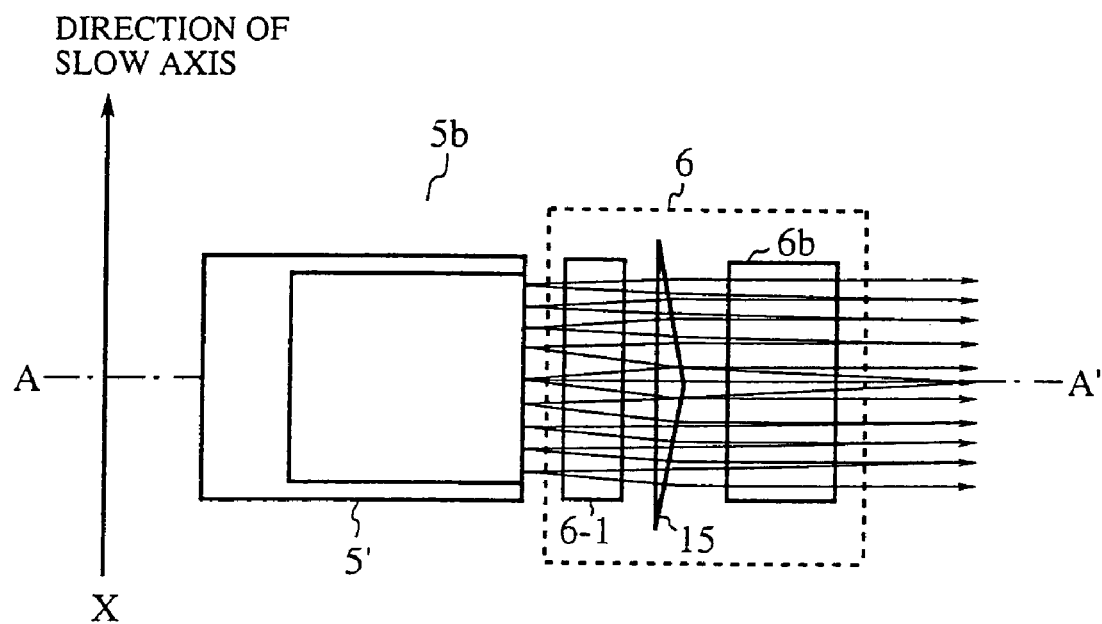
FIG. 14(A) is a cross-sectional view showing the structure of a semiconductor laser light emitting apparatus according to a fourth embodiment of the present invention, the view being taken on the plane of the slow axis.
Figure 14B:
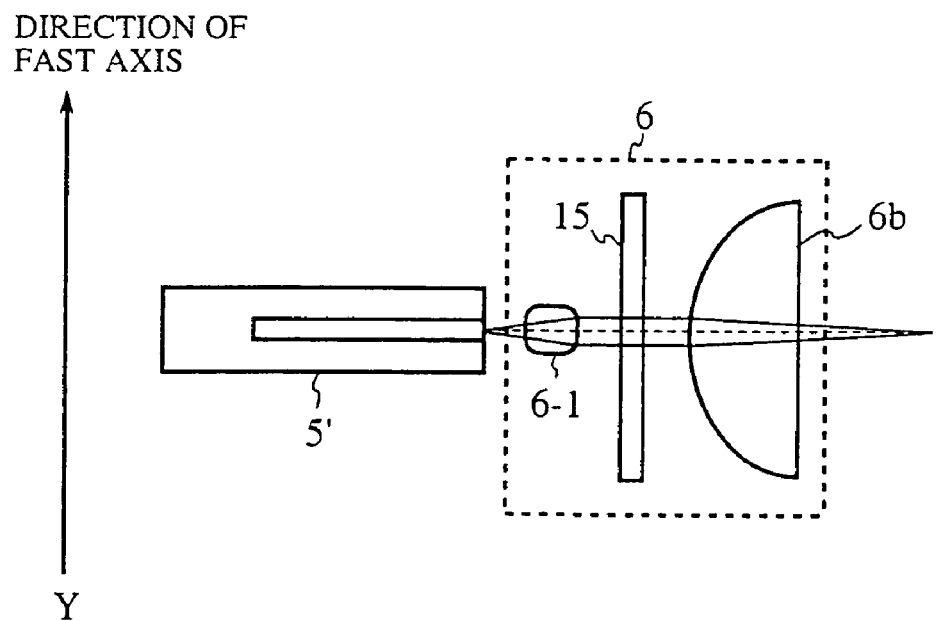
FIG. 14(B) is a cross-sectional view taken along the line A–A' of FIG. 14(A)

Referring to next to FIGS. 14(A) and 14(B), there are illustrated diagrams showing the structure of a semiconductor laser light emitting apparatus according to a fourth embodiment of the present invention. FIG. 14(A) is a cross-sectional view taken on the plane of the slow axis of an array-type semiconductor laser. FIG. 14(B) is a cross-sectional view taken along the line A–A' of FIG. 14(B). In FIGS. 14(A) and 14(B), reference numeral 5' denotes the array-type semiconductor laser that consists of a bar-shaped component including a plurality of laser-light-emitting end portions stacked in the direction of the slow axis. The laser light emitted out of the array-type semiconductor laser 5' has a divergence angle of about, 10 degrees with respect to the direction of the slow axis, and a divergence angle of about 10 degrees with respect to the direction of the fast axis.

Reference numeral 6 denotes a semiconductor laser light focusing component for focusing the laser light emitted out of the array-type semiconductor laser 5', 6-1 denotes a cylindrical lens that is opposite to the bar-shaped component and that is located at a distance of about its focal length from the bar-shaped component of the array-type semiconductor laser 5', for collimating the laser light emitted out of the bar-shaped component, 6b denotes an aspherical lens for focusing the semiconductor laser light collimated by the cylindrical lens 6-1 with respect to the direction of the fast axis of the array-type semiconductor laser 5', and 15 denotes a roof prism for refracting the laser light emitted out of the array-type semiconductor laser 5'. The roof prism 15 is placed so that the ridgeline of the roof prism 15 is parallel to the fast axis of the semiconductor laser, and the face of the roof prism 15 opposite to the ridgeline is substantially perpendicular to the direction in which the semiconductor laser light travels. The roof prism 15 thus refracts the semiconductor laser light emitted out of the cylindrical lens 6-1 with respect to the direction of the slow axis.

The semiconductor laser light focusing component 6 of the present embodiment is the same as that of the aforementioned first embodiment, and therefore the description of the semiconductor laser light focusing component 6 will be omitted hereinafter. Next, a description of the roof prism 15 will be made in detail, and then a description will be made as to the operation of the semiconductor laser light emitting apparatus of the fourth embodiment.

It is necessary to reduce the transverse size of the semiconductor laser light beam in the direction of the slow axis, i.e., the length of one side of a cross section of the laser light running in the direction of the slow axis, in order to focus the energy of all the semiconductor laser light to a limited cross section having an arbitrary area. The roof prism 15 is located between the cylindrical lens 6-1 and the aspherical lens 6b and the cut faces including the ridgeline of the roof prism 15 are inclined in the direction of the slow axis so that the cut faces are not perpendicular to the direction in which the semiconductor laser light travels. The roof prism 15 can thus refract the semiconductor laser light with respect to the direction of the slow axis. As a result, every ray of the semiconductor laser light incident on the roof prism 15 is refracted and is then inclined an arbitrary angle toward the center line (i.e., the line A–A' of FIG. 14(A)). Accordingly, the semiconductor laser light focusing component 6 including the roof prism 15 can refract the semiconductor laser light having a divergence angle at an arbitrary distance from the array-type semiconductor laser 5' so that the transverse size of the semiconductor laser light beam in the direction of the slow axis can be reduced to a small one.

The cylindrical lens 6-1 collimates the laser light emitted out of the array-type semiconductor laser 5' with respect to the direction of the fast axis of the semiconductor laser. The laser light emerging from the cylindrical lens 6-1 is refracted with respect to the direction of the slow axis by the roof prism 15. The transverse size, in the direction of the slow axis, of the laser light beam emerging from the roof prism 15, is reduced so as to be smaller than the width of the aspherical lens 6b in the direction of the slow axis. The aspherical lens 6b then focuses the laser light incident thereon to a linear cross section with respect to the direction of the fast axis. That is, the linear cross section has a longer side running in the direction of the slow axis. As a result, all the semiconductor laser light can be focused to the limited linear cross section at a distance of the focal length of the aspherical lens 6b, and therefore the energy utilization efficiency can be improved. Thereby, the size of the whole of the semiconductor laser light emitting apparatus 5b can be reduced.

The arrangement of the roof prism 15 is not limited to the above case, as shown in FIGS. 14(A) and 14(B), where the roof prism 15 is placed between the cylindrical lens 6-1 and the aspherical lens 6b. The roof prism 15 can be placed anywhere on the light axis of the semiconductor laser light if it can inject the laser light into a semiconductor laser light guiding component (not shown) while it reduces the divergence angle of the laser light with respect to the direction of the slow axis.

As previously mentioned, in accordance with the fourth embodiment, since the semiconductor laser light emitting apparatus 5b is comprised of the array-type semiconductor laser 5', the semiconductor laser light focusing component 6, and the roof prism 15, the semiconductor laser light emitting apparatus 5b can generate combined laser light having a high power density with a high degree of efficiency from the semiconductor laser light emitted out of each of the plurality of laser-light-emitting end portions. Also, the physical size of the semiconductor laser light emitting apparatus 5b can be reduced.

Fifth Embodiment

Figure 15A:
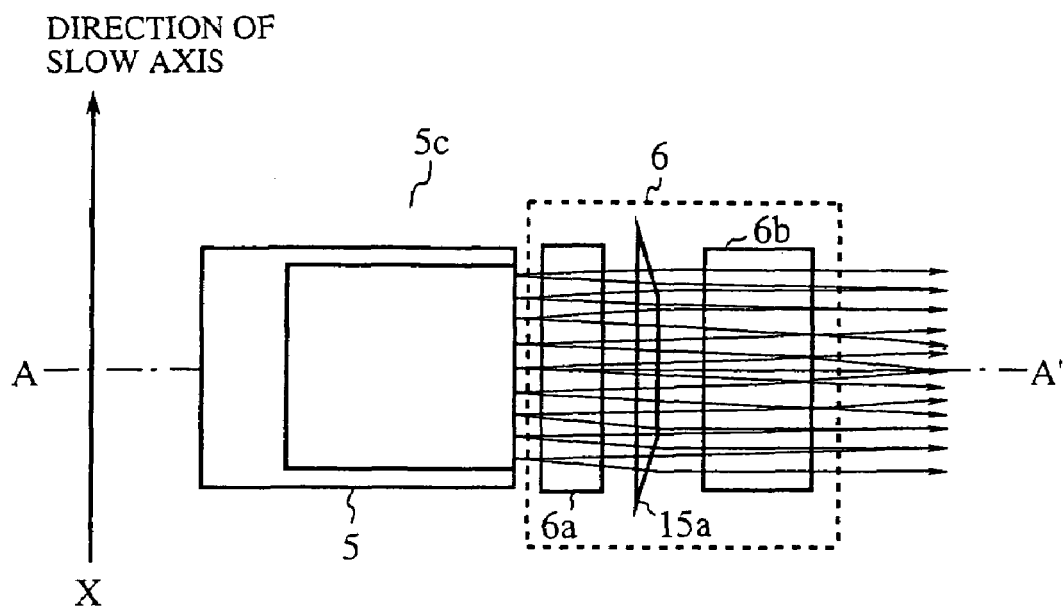
FIG. 15(A) is a cross-sectional view showing the structure of a semiconductor laser light emitting apparatus according to a fifth embodiment of the present invention, the view being taken on the plane of the slow axis.
Figure 15B:
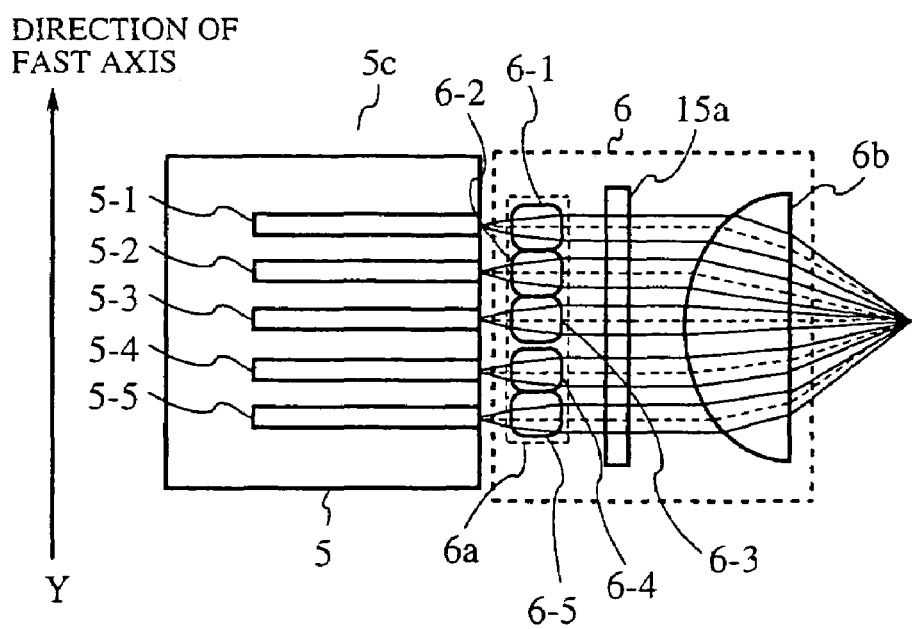
FIG. 15(B) is a cross-sectional view taken along the line A–A' of FIG. 15(A)

Referring to next to FIGS. 15(A) and 15(B), there are illustrated diagrams showing the structure of a semiconductor laser light emitting apparatus according to a fifth embodiment of the present invention. FIG. 15(A) is a cross-sectional view taken on the plane of the slow axis of a stack-type semiconductor laser 5. FIG. 15(B) is a cross-sectional view taken along the line A–A' of FIG. 15(A). In FIGS. 15(A) and 15(B), reference numerals 5-1 to 5-5 denote bar-shaped components that constitute the stack-type semiconductor laser 5, respectively. In the stack-type semiconductor laser 5, the plurality of bar-shaped components 5-1 to 5-5 are stacked in the direction of the fast axis, and each of the plurality of bar-shaped components 5-1 to 5-5 includes a plurality of laser-light-emitting end portions that are aligned and integrated in the direction of the slow axis. The laser light emitted out of each of the plurality of bar-shaped components 5-1 to 5-5 has a divergence angle of about 10 degrees with respect to the direction of the slow axis, and a divergence angle of about 10 degrees with respect to the direction of the fast axis.

Reference numeral 6 denotes a semiconductor laser light focusing component for focusing the laser light emitted out of each of the plurality of bar-shaped components 5-1 to 5-5, 6a denotes a cylindrical lens array comprised of cylindrical lenses 6-1 to 6-5 that are opposite to the plurality of bar-shaped components 5-1 to 5-5, respectively, and that are respectively located at a distance of about their focal length from the plurality of bar-shaped components 5-1 to 5-5, each of the plurality of cylindrical lenses 6-1 to 6-5 collimating the laser light emitted out of each of the plurality of bar-shaped components 5-1 to 5-5, and 6b denotes an aspherical lens for focusing the semiconductor laser light collimated by each of the cylindrical lenses 6-1 to 6-5 with respect to a direction parallel to the direction in which the plurality of bar-shaped components 5-1 to 5-5 are stacked, i.e., the direction of the fast axis.

Reference numeral 15a denotes a quadrangular prism for refracting the laser light emitted out of the stack-type semiconductor laser 5. The quadrangular prism 15a has a trapezoidal cross section. In other words, it can be assumed that the quadrangular prism 15a is formed by separating part of a roof prism including its ridgeline from the roof prism by cutting the roof prism at a longitudinal cross section parallel to the lateral face of the roof prism opposite to the ridgeline of the roof prism. The quadrangular prism 15a is placed so that its virtual ridgeline, which does not exist in reality, is parallel to the fast axis of the semiconductor laser, and the two parallel lateral faces of the quadrangular prism 15a are substantially perpendicular to the direction in which the semiconductor laser light travels. The quadrangular prism 15a thus partially refracts the semiconductor laser light emitted out of each of the plurality of cylindrical lenses 6-1 to 6-5 in the direction of the slow axis. As shown in FIGS. 15(A) and 15(B), the stack-type semiconductor laser is comprised of five bar-shaped components 5-1 to 5-5, and the cylindrical lens array 6a is comprised of five cylindrical lenses 6-1 to 6-5. As an alternative, the stack-type semiconductor laser can be comprised of five or more bar-shaped components, and the cylindrical lens array 6a can be comprised of five or more cylindrical lenses.

The semiconductor laser light focusing component 6 of the present embodiment is the same as that of the aforementioned first embodiment, and therefore the description of the semiconductor laser light focusing component 6 will be omitted hereinafter. Next, a description of the quadrangular prism 15a will be made in detail, and then a description will be made as to the operation of the semiconductor laser light emitting apparatus of the fifth embodiment.

The quadrangular prism 15a refracts every ray of the semiconductor laser light incident on the cut faces (or lateral faces) of prism 15a including the virtual ridgeline that does not exist in reality, so that every ray of the semiconductor laser light is inclined an arbitrary angle toward the center line (i.e., the line A–A' of FIG. 15(A)). Accordingly, the quadrangular prism 15a can refract the semiconductor laser light having a divergence angle at an arbitrary distance from the stack-type semiconductor laser 5 so that the transverse size of the semiconductor laser light beam in the direction of the slow axis can be reduced to a small one.

Each of the plurality of cylindrical lenses 6-1 to 6-5 collimates the laser light emitted out of each of the plurality of bar-shaped components 5-1 to 5-5 with respect to the direction of the fast axis. The laser light emerging from each of the plurality of cylindrical lenses 6-1 to 6-5 is partially refracted with respect to the direction of the slow axis by the quadrangular prism 15a. The transverse size, in the direction of the slow axis, of the laser light beam emerging from the quadrangular prism 15a is thus reduced so as to be smaller than the width of the aspherical lens 6b with respect to the direction of the slow axis. The aspherical lens 6b then focuses the laser light incident thereon to a linear cross section with respect to a direction parallel to the direction in which the plurality of bar-shaped components 5-1 to 5-5 are stacked, i.e., the direction of the fast axis. That is, the linear cross section has a longer side running in the direction of the slow axis. As a result, all the semiconductor laser light can be focused to a limited cross section at a distance of the focal length of the aspherical lens 6b, and therefore the energy utilization efficiency can be improved. Thereby, the size of the whole of the semiconductor laser light emitting apparatus 5c can be reduced.

The arrangement of the quadrangular prism 15a is not limited to the above case, as shown in FIGS. 15(A) and 15(B), where the quadrangular prism 15a is placed between the cylindrical lens array 6a and the aspherical lens 6b. The quadrangular prism 15a can be placed anywhere on the light axis of the semiconductor laser light if it can inject the laser light into a semiconductor laser light guiding component while it reduces the divergence angle of the laser light with respect to the direction of the slow axis.

Instead of providing the quadrangular prism 15a as the semiconductor laser light refracting component, the semiconductor laser light emitting apparatus 5c can include a roof prism 15 as shown in FIGS. 14(A) and 14(B), thereby offering the same advantage. Needless to say, in the aforementioned fourth embodiment, the quadrangular prism 15a as shown in FIGS. 15(A) and 15(B) can be used as the semiconductor laser light refracting component instead of the roof prism 15.

As previously mentioned, in accordance with the fifth embodiment, since the semiconductor laser light emitting apparatus 5c is comprised of the stack-type semiconductor laser 5, the semiconductor laser light focusing component 6, and the quadrangular prism 15a, the semiconductor laser light emitting apparatus 5c can generate combined laser light having a high power density with a high degree of efficiency from the semiconductor laser light emitted out of each of the plurality of bar-shaped components. Also, the physical size of the semiconductor laser light emitting apparatus 5c can be reduced.

Sixth Embodiment

In accordance with a sixth embodiment of the present invention, a semiconductor laser light emitting apparatus 5c according to the aforementioned fifth embodiment is applied to the solid-state laser rod pumping module according to the aforementioned first embodiment.

Figure 16A:
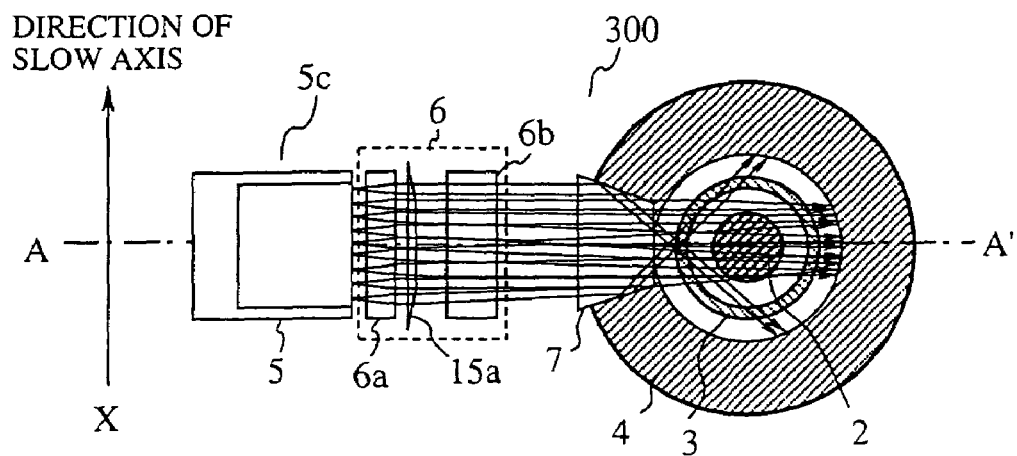
FIG. 16(A) is a cross-sectional view showing the structure of a solid-state laser rod pumping module according to a sixth embodiment of the present invention, the view being taken on the plane of the slow axis.
Figure 16B:
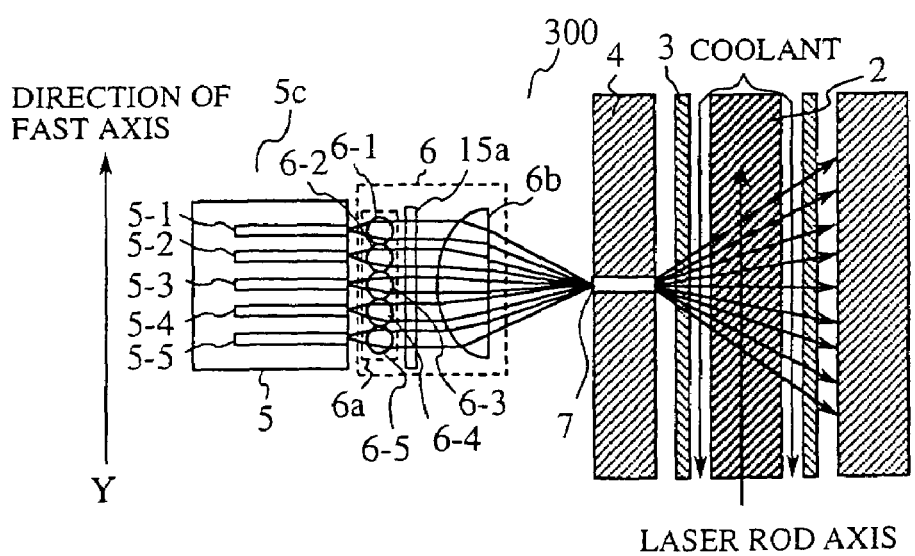
FIG. 16(B) is a cross-sectional view taken along the line A–A' of FIG. 16(A)

Referring next to FIGS. 16(A) and 16(B), there are illustrated cross sectional views showing the structure of the solid-state laser rod pumping module according to the sixth embodiment of the present invention. FIG. 16(A) is a cross-sectional view of the solid-state laser rod pumping module, the view being taken on the plane of the slow axis of a stack-type semiconductor laser 5, and FIG. 16(B) is a cross-sectional view taken along the line A–A' of FIG. 16(A). In the figures, reference numeral 300 denotes the solid-state laser rod pumping module, 5c denotes the semiconductor laser light emitting apparatus for use in the solid-state laser rod pumping module 300, and 2 denotes a solid-state laser rod whose axis is parallel to the fast axis of a stack-type semiconductor laser 5 included in the semiconductor laser light emitting apparatus 5c. Other components designated by the same reference numerals as shown in FIG. 1 are the same as those of the solid-state laser rod pumping module of the aforementioned first embodiment, and therefore the description of the other components will be omitted hereinafter.

Next, a description will be made mainly as to the difference between the operation of the solid-state laser rod pumping module of the sixth embodiment and that of the solid-state laser rod pumping module of the first embodiment.

Laser light emitted out of the stack-type semiconductor laser 5 is focused with respect to the direction of the fast axis of the semiconductor laser 5 by the cylindrical lens array 6a, and is then refracted partially with respect to the direction of the slow axis by the quadrangular prism 15a disposed as the semiconductor laser light refracting component. The transverse size, in the direction of the slow axis, of the laser light beam emerging from the quadrangular prism 15a is reduced so as to be smaller than the width of the aspherical lens 6b with respect to the direction of the slow axis. The aspherical lens 6b focuses the laser light incident thereon to a linear cross section with respect to the direction in which the plurality of bar-shaped components 5-1 to 5-5 are stacked, i.e., the direction of the fast axis. The linearly-focused laser light is then injected into the solid-state laser rod 2 by way of the semiconductor laser light guiding component 7. In the aforementioned first embodiment, the semiconductor laser light guiding component 7 increases in size up to such an extent that it protrudes from the diffusive reflection tube 4 and hence the first face upon which the laser light from the aspherical lens 6b is incident increases in size, as shown in FIG. 1(B), because the aspherical lens 6b has to be placed so that the transverse size, in the direction of the slow axis, of the laser light beam emerging from the cylindrical lens array 6a is reduced so as to be smaller than the width of the aspherical lens 6b with respect to the direction of the slow axis, that is, the aspherical lens 6b has to be placed at a position closer to the cylindrical lens array 6a. Accordingly, the semiconductor laser light guiding component 7 of the first embodiment can not improve the efficiency of trapping the laser light. In contrast to the first embodiment, according to the sixth embodiment, the quadrangular prism 15a makes it possible for all the laser light emerging from the cylindrical lens 6a to enter the aspherical lens 6b even though the semiconductor laser light guiding component 7 is placed so as not to protrude from the diffusive reflection tube 4, as shown in FIG. 16(B). Accordingly, the semiconductor laser light guiding component 7 of the sixth embodiment can improve the efficiency of trapping the laser light. After that, the solid-state laser rod pumping module of the sixth embodiment operates in the same manner as that of the first embodiment does, and therefore the description of the subsequent operation to be done after the laser light is incident on the semiconductor laser light guiding component 7 will be omitted hereinafter.

As previously mentioned, in accordance with the sixth embodiment, the solid-state laser rod pumping module can generate laser light whose divergence angle with respect to the direction of the fast axis is reduced by the semiconductor laser light focusing component 6 and whose divergence angle with respect to the direction of the slow axis is reduced by the quadrangular prism 15a. The solid-state laser rod pumping module can thus generate combined laser light having a high power density with a high degree of efficiency. In particular, since the divergence angle of the laser light with respect to the direction of the slow axis is reduced by the quadrangular prism 15a, the size of the semiconductor laser light guiding component 7 in the direction of the slow axis can be reduced and therefore the semiconductor laser light guiding component 7 can improve the efficiency of trapping the laser light. Thereby, the solid-state laser rod 2 can be pumped with high power and with a high degree of efficiency. Furthermore, the physical size of the semiconductor laser light emitting apparatus 5c can be reduced, and hence the whole of the solid-state laser rod pumping module 300 can be downsized.

Seventh Embodiment

In contrast to the solid-state laser rod pumping module of the aforementioned sixth embodiment in which the axis of the solid-state laser rod is parallel with the direction of the fast axis of the semiconductor laser light emitting apparatus included in the module, a solid-state laser rod pumping module of a seventh embodiment includes a solid-state laser rod whose axis is parallel with the direction of the slow axis of a semiconductor laser included in the module.

Figure 17A:
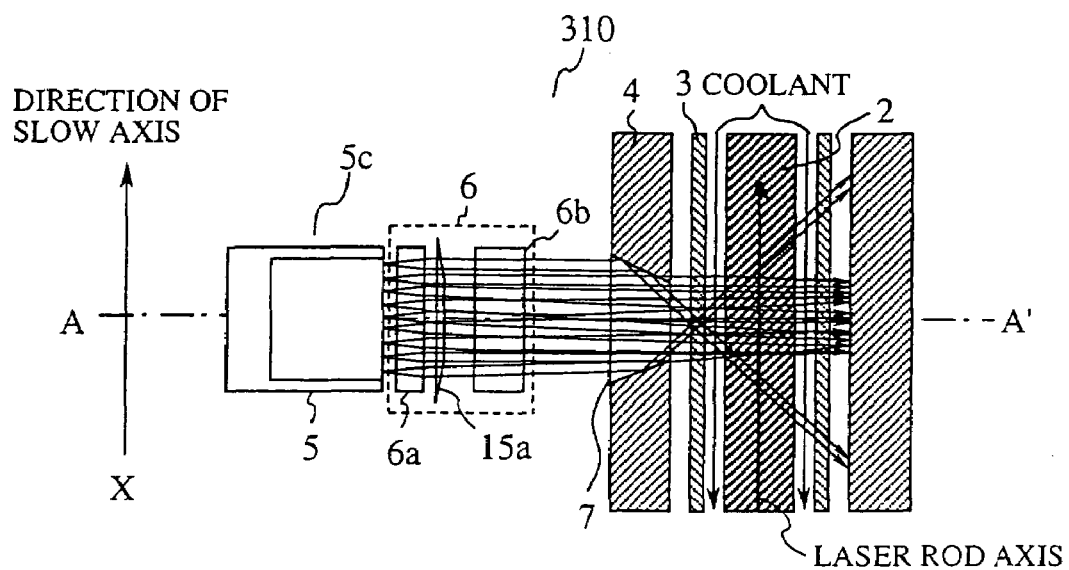
FIG. 17(A) is a cross-sectional view showing the structure of a solid-state laser rod pumping module according to a seventh embodiment of the present invention, the view being taken on the plane of the slow axis.
Figure 17B:
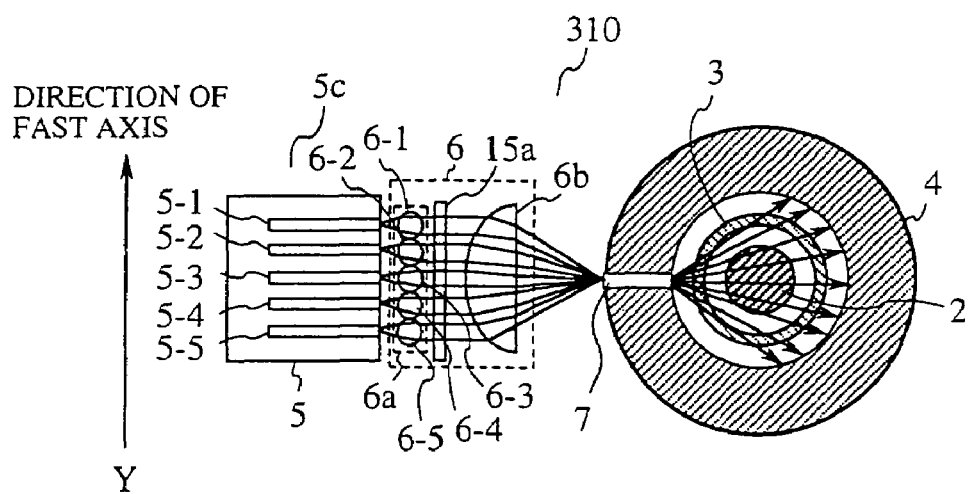
FIG. 17(B) is a cross-sectional view taken along the line A–A' of FIG. 17(A)

Referring next to FIGS. 17(A) and 17(B), there are illustrated cross sectional views showing the structure of the solid-state laser rod pumping module according to the seventh embodiment of the present invention. FIG. 17(A) is a cross-sectional view of the solid-state laser rod pumping module, the view being taken on the plane the slow axis of the stack-type semiconductor laser 5, and FIG. 17(B) is a cross-sectional view taken along the line A–A' of FIG. 17(A). In the figures, reference numeral 310 denotes the solid-state laser rod pumping module, 5c denotes the semiconductor laser light emitting apparatus for use in the solid-state laser rod pumping module 310, and 2 denotes the solid-state laser rod whose axis is parallel to the slow axis of a stack-type semiconductor laser 5 included in the semiconductor laser light emitting apparatus 5c. Other components designated by the same reference numerals as shown in FIG. 1 are the same as those of the solid-state laser rod pumping module of the aforementioned first embodiment, and therefore the description of the other components will be omitted hereinafter.

As shown in FIGS. 7(A) and 7(B), the semiconductor laser light guiding component 7 is comprised of a slit 11 formed in a diffusive reflection tube 4, a hexahedron-shaped slab wave guide 12 located within the slit 11, and an adhesive layer 13 formed in space between faces of the slab wave guide 12 other than a first face 12a via which the semiconductor laser light is incident on the slab wave guide 12 and a second face 12b via which the semiconductor laser light emerges from the slab wave guide 12, and the slit 11. The adhesive layer 13 has a lower refractive index than the slab wave guide 12. According to the seventh embodiment, the area of the first face 12a is smaller than that of the second face 12b, and therefore the amount of semiconductor laser light that escapes from the semiconductor laser light guiding component 7 can be reduced and the solid-state laser rod 2 can be pumped with a high degree of efficiency. The solid-state laser rod pumping module of the seventh embodiment can thus generate combined laser light having a high power density with a high degree of efficiency. Further, the size of the solid-state laser rod pumping module can be reduced.

Eighth Embodiment

In accordance with an eighth embodiment of the present invention, a semiconductor laser light emitting apparatus 5c according to the aforementioned fifth embodiment is applied to the solid-state laser rod pumping module according to the aforementioned second embodiment.

Figure 18A:
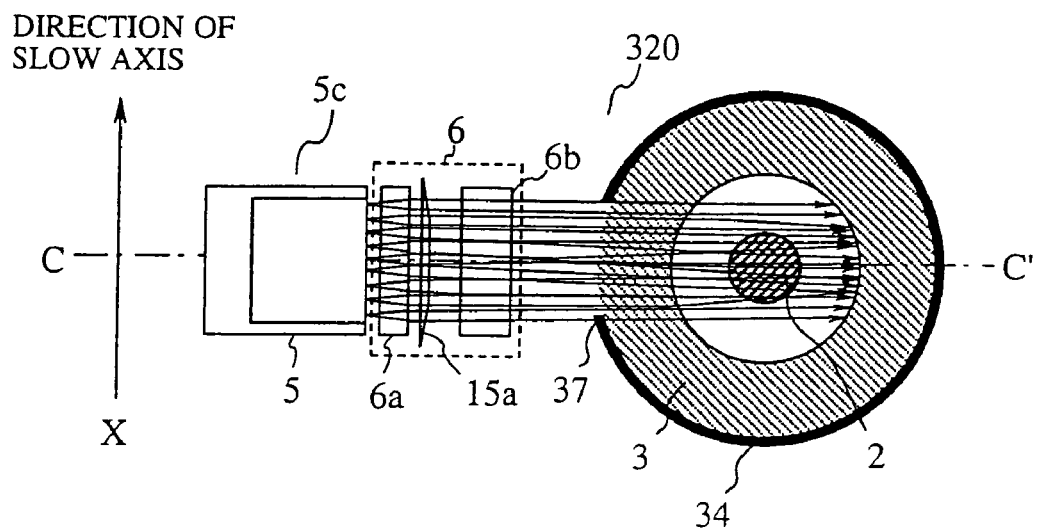
FIG. 18(A) is a cross-sectional view showing the structure of a solid-state laser rod pumping module according to an eighth embodiment of the present invention, the view being taken on the plane of the slow axis.
Figure 18B:
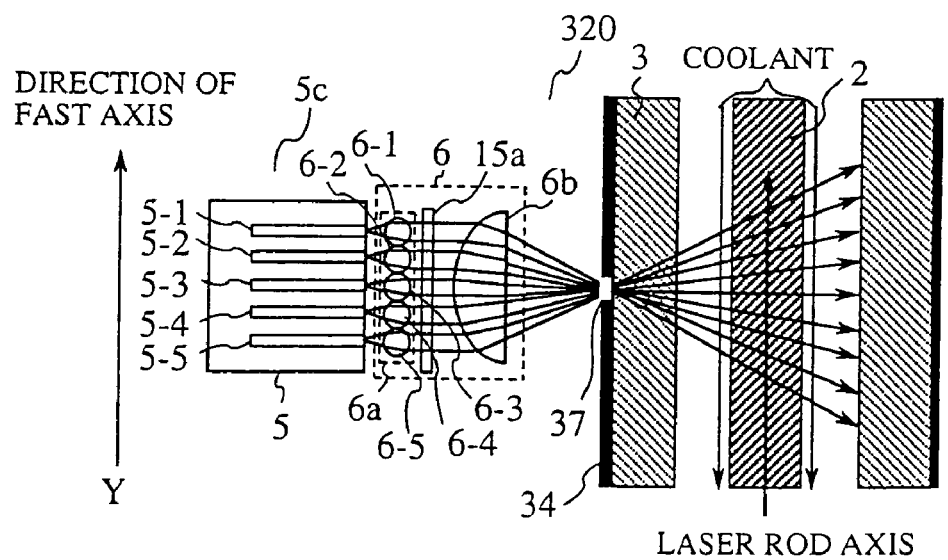
FIG. 18(B) is a cross-sectional view taken along the line C–C' of FIG. 18(A)
Figure 19:
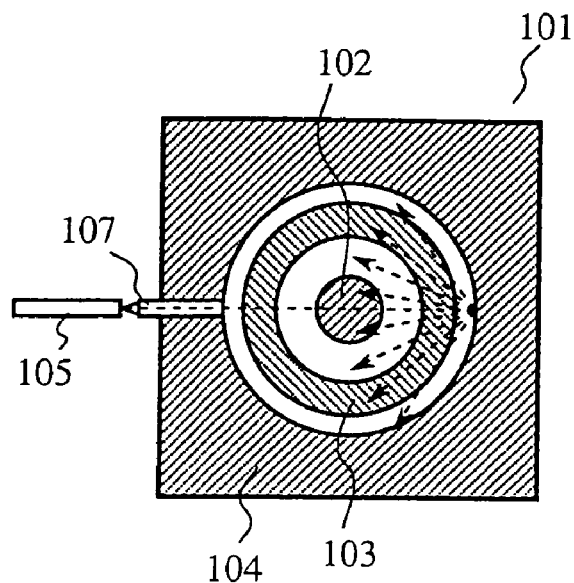
FIG. 19 is a cross-sectional view showing the structure of a prior art solid-state laser rod pumping module.
Figure 20:
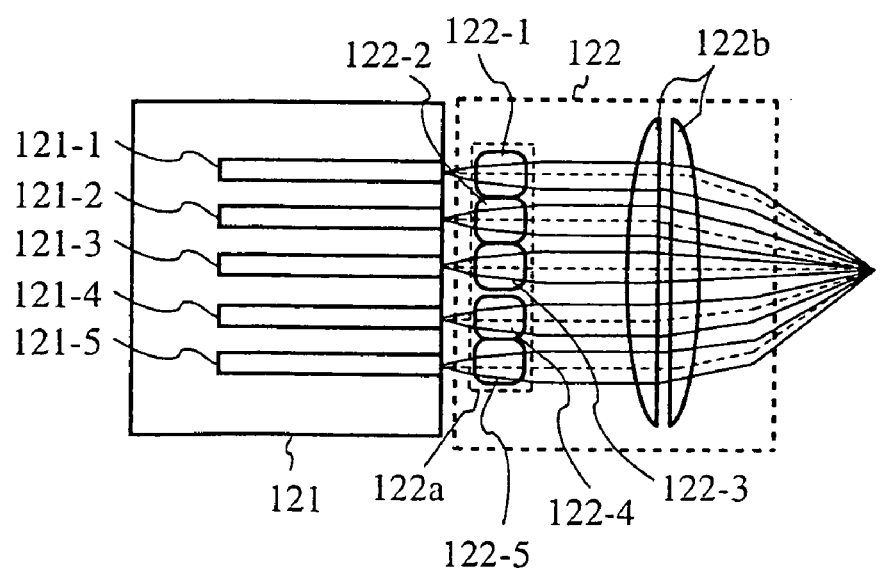
FIG. 20 is a cross-sectional view showing the structure of a prior art semiconductor laser light emitting apparatus for use in another prior art solid-state laser rod pumping module.
Figure 21:
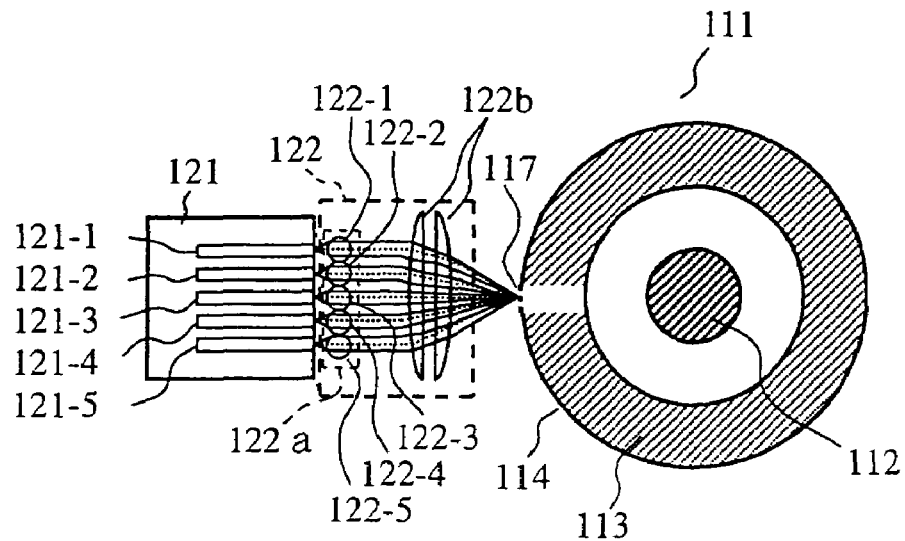
FIG. 21 is a cross-sectional view showing the structure of the other prior art solid-state laser rod pumping module including the prior art semiconductor laser light emitting apparatus of FIG. 20.
Figure 22:
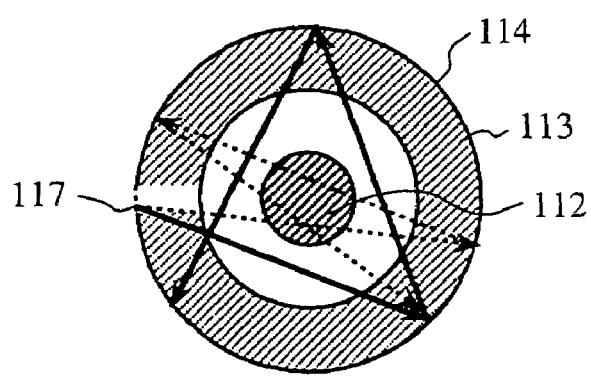
FIG. 22 is a cross-sectional view for explaining a disadvantage of the other prior art solid-state laser rod pumping module of FIG. 20.

Referring next to FIGS. 18(A) and 18(B), there are illustrated cross sectional views showing the structure of the solid-state laser rod pumping module according to the eighth embodiment of the present invention. FIG. 18(A) is a cross-sectional view of the solid-state laser rod pumping module, the view being taken on the plane of the slow axis of a stack-type semiconductor laser 5 included in the semiconductor laser light emitting apparatus 5c, and FIG. 18(B) is across-sectional view taken along the line C–C' of FIG. 18(A). In the figures, reference numeral 320 denotes the solid-state laser rod pumping module, 34 denotes a mirror-reflective reflection tube that is disposed on substantially the same axis as a solid-state laser rod 2 so that it surrounds the solid-state laser rod 2, and that is so constructed as to mirror-reflect semiconductor laser light incident thereon, and 37 denotes a semiconductor laser light focusing component formed in the mirror-reflective reflection tube 34, for guiding the semiconductor laser light focused by the semiconductor laser light focusing component 6 into the interior of the mirror-reflective reflection tube 34. Other components designated by the same reference numerals as shown in FIGS. 12(A) and (B) are the same as those of the solid-state laser rod pumping module of the aforementioned second embodiment, and therefore the description of the other components will be omitted hereinafter.

The cylindrical lens array 6a collimates the laser light emitted out of each of the plurality of bar-shaped components 5-1 to 5-5 with respect to the direction of the fast axis of the stack-type semiconductor laser 5. The laser light emerging from the cylindrical lens array 6a is partially refracted with respect to the direction of the slow axis by the quadrangular prism 15a. The length of one side of a cross section, running in the direction of the slow axis, of the laser light emerging from the quadrangular prism 15a is reduced so as to be smaller than the width of the aspherical lens 6b with respect to the direction of the slow axis. The aspherical lens 6b then focuses the laser light incident thereon to a linear cross section with respect to a direction parallel to the direction in which the plurality of bar-shaped components 5-1 to 5-5 are stacked (i.e. the direction of the fast axis). That is, the linear cross section has a longer side running in the direction of the slow axis. One side of the linear cross section running in the direction of the slow axis can thus be reduced to be smaller than the width of the semiconductor laser light guiding component 37 with respect to the direction of the slow axis. The focused semiconductor laser light then enters the interior of the mirror-reflective reflection tube 34 by way of the semiconductor laser light guiding component 37 that consists of the non-reflective coating disposed at the focal length of the aspherical lens 6b.

As previously mentioned, in accordance with the eighth embodiment, the solid-state laser rod pumping module can generate laser light whose divergence angle with respect to the direction of the fast axis is reduced by the semiconductor laser light focusing component 6 and whose divergence angle with respect to the direction of the slow axis is reduced by the quadrangular prism 15*a*. The solid-state laser rod pumping module can thus generate combined laser light having a high power density with a high degree of efficiency. Thereby, the solid-state laser rod 2 can be pumped with high power and with a high degree of efficiency, and laser light with a high beam quality can be provided. Furthermore, the physical size of the semiconductor laser light emitting apparatus 5*c* can be reduced, and hence the whole of the solid-state laser rod pumping module 320 can be downsized.

In the eighth embodiment, the solid-state laser rod 2, the cooling sleeve 3, and the mirror-reflective reflection tube 34 are configured so that the axis of the solid-state laser rod 2 is parallel with the fast axis of the stack-type semiconductor laser 5, the cooling sleeve 3 is disposed on substantially the same axis as the solid-state laser rod 2 so that it surrounds the solid-state laser rod 2, and the mirror-reflective reflection tube 34 is located on substantially the same axis as the solid-state laser rod 2 so that it surrounds the solid-state laser rod 2 and the cooling sleeve 3, as previously mentioned. As an alternative, the solid-state laser rod 2, the cooling sleeve 3, and the mirror-reflective reflection tube 34 can be configured so that the axis of the solid-state laser rod 2 is parallel with the slow axis of the stack-type semiconductor laser 5, the cooling sleeve 3 is disposed on substantially the same axis as the solid-state laser rod 2 so that it surrounds the solid-state laser rod 2, and the mirror-reflective reflection tube 34 is located on substantially the same axis as the solid-state laser rod 2 so that it surrounds the solid-state laser rod 2 and the cooling sleeve 3. This variant offers the same advantage.

In contrast to the solid-state laser rod pumping module according to the aforementioned second embodiment in which the semiconductor laser light diffusing component 8 is disposed in the mirror-reflective reflection tube 34, according to the eighth embodiment, there is no need to change the focal length of the aspherical lens 6*b* so that the converging angle of the aspherical lens 6*b* falls within an angle that is formed by two lines connecting both edges of the solid-state laser rod 2 with the semiconductor laser light guiding component 37 when viewed from the semiconductor laser light guiding component 37 in one plane perpendicular to the axis of the solid-state laser rod 2. This results in eliminating the need for increasing the size of the semiconductor laser light guiding component 37 even though the mirror-reflective reflection tube 34 does not include the semiconductor laser light diffusing component 8 (according to the eighth embodiment, the size of the semiconductor laser light guiding component 37 can be reduced significantly as compared with the second embodiment, as shown in FIGS. 12(A) and 18(A)). Thus a reduction in the efficiency of trapping the semiconductor laser light within the mirror-reflective reflection tube 34 can be prevented.

In the above-mentioned sixth to eighth embodiments, the quadrangular prism 15*a* serves as the semiconductor laser light refracting component, as mentioned above. As an alternative, a roof prism can serve as the semiconductor laser light refracting component. In this case, the same advantages as provided by the above-mentioned sixth to eighth embodiments can be offered.

Many widely different embodiments of the present invention may be constructed without departing from the spirit and scope of the present invention. It should be understood that the present invention is not limited to the specific embodiments described in the specification, except as defined in the appended claims.

What is claimed is:

1. A solid-state laser rod excitation module comprising:
a cooling sleeve disposed on substantially the same axis as a solid-state laser rod so that it surrounds said solid-state laser rod;
a diffusive reflection tube disposed on substantially the same axis as said solid-state laser rod so that it surrounds said solid-state laser rod and said cooling sleeve;
a semiconductor laser light emitting means including a semiconductor laser provided with at least one bar-shaped, or rectangular, component including a plurality of laser-light-emitting portions aligned and integrated in a direction of a slow axis of said semiconductor laser, a semiconductor laser light focusing means for focusing laser light emitted out of said semiconductor laser with respect to a direction of a fast axis of said semiconductor laser, and a semiconductor laser light refracting means for refracting all rays or some rays of the laser light emitted out of said semiconductor laser with respect to the direction of the slow axis of said semiconductor laser, said semiconductor laser light emitting means being configured so that the slow axis of said semiconductor laser is parallel to the axis of said solid-state laser rod and emitting the laser light towards said diffusive reflection tube; and
a semiconductor laser light guiding means disposed in said diffusive reflection tube, for guiding the laser light emitted out of said semiconductor laser light emitting means and incident thereon to an end portion thereof while substantially maintaining the length of one side of a cross section of the laser light emitted out of said semiconductor laser light emitting means, the side running in a direction parallel to the fast axis, and for guiding the laser light toward said solid-state laser rod located within said diffusive reflection tube.

2. The solid-state laser rod excitation module according to claim 1, wherein said semiconductor laser has only one bar-shaped component including a plurality of laser-light-emitting portions aligned and integrated in the direction of the slow axis of said semiconductor laser.

3. The solid-state laser rod excitation module according to claim 1, wherein said semiconductor laser has a plurality of bar-shaped components that are stacked in the direction of the fast axis of said semiconductor laser, each of said plurality of bar-shaped components including a plurality of laser-light-emitting portions aligned and integrated in the direction of the slow axis of said semiconductor laser.

4. The solid-state laser rod excitation module according to claim 1, wherein said semiconductor laser light guiding means includes a slit formed in said diffusive reflection tube, a hexahedron-shaped slab wave guide located in said slit, and an adhesive layer formed in space between faces of said slab wave guide other than a first face via which the laser light is incident on said slab wave guide and a second face via which the laser light emerges from said slab wave guide, and said slit, said adhesive layer having a lower refractive index than said slab wave guide.

5. The solid-state laser rod excitation module according to claim 4, wherein the area of said first face of said slab wave guide is less than that of said second face of said slab wave guide, and the length of one side of said second face running in a direction orthogonal to the axis of said solid-state laser rod is greater than the diameter of said solid-state laser rod.

6. The solid-state laser rod excitation module according to claim 4, wherein said slab wave guide is so constructed that the laser light incident thereon is reflected off one face of said slab wave guide, which is parallel to the fast axis of said semiconductor laser, at most once while it travels within said slab wave guide.

7. The solid-state laser rod excitation module according to claim 1, further comprising a semiconductor laser light diffusing means disposed between said semiconductor laser light guiding means and said solid-state laser rod, for diffusing the laser light guided by said semiconductor laser light guiding means.

8. The solid-state laser rod excitation module according to claim 7, wherein said semiconductor laser light diffusing means is made of a transparent optical material whose surface is ground or rough like a ground glass.

9. The solid-state laser rod excitation module according to claim 7, wherein said semiconductor laser light diffusing means is made of a transparent foaming glass material including bubbles therein.

10. The solid-state laser rod excitation module according to claim 8, wherein said semiconductor laser light diffusing means is formed on said cooling sleeve.

11. The solid-state laser rod excitation module according to claim 8, wherein said semiconductor laser light diffusing means is made of sapphire whose surface is ground or rough like a ground glass.

12. A solid-state laser rod excitation module comprising:
a cooling sleeve disposed on substantially the same axis as a solid-state laser rod so that it surrounds said solid-state laser rod;
a mirror-reflective reflection tube disposed on substantially the same axis as said solid-state laser rod so that it surrounds said solid-state laser rod and said cooling sleeve;
a semiconductor laser light emitting means including a semiconductor laser provided with at least one bar-shaped, or rectangular, component including a plurality of laser-light-emitting portions aligned and integrated in a direction of a slow axis of said semiconductor laser, a semiconductor laser light focusing means for focusing laser light emitted out of said semiconductor laser with respect to a direction of a fast axis of said semiconductor laser, and a semiconductor laser light refracting means for refracting all rays or some rays of the laser light emitted out of said semiconductor laser with respect to the direction of the slow axis of said semiconductor laser, said semiconductor laser light emitting means being configured so that the slow axis of said semiconductor laser is parallel to the axis of said solid-state laser rod and emitting the laser light towards said diffusive reflection tube; and
a semiconductor laser light guiding means disposed in said mirror-reflective reflection tube, for guiding the laser light emitted out of said semiconductor laser light emitting means and incident thereon to an end portion thereof while substantially maintaining the length of one side of a cross section of said semiconductor laser light, which is running in a direction parallel to the fast axis, and for guiding the laser light toward said solid-state laser rod located within said mirror-reflective reflection tube.

13. The solid-state laser rod excitation module according to claim 12, wherein said semiconductor laser has only one bar-shaped component including a plurality of laser-light-emitting portions aligned and integrated in the direction of the slow axis of said semiconductor laser.

14. The solid-state laser rod excitation module according to claim 12, wherein said semiconductor laser has a plurality of bar-shaped components that are stacked in the direction of the fast axis of said semiconductor laser, each of said plurality of bar-shaped components including a plurality of laser-light-emitting portions aligned and integrated in the direction of the slow axis of said semiconductor laser.

15. The solid-state laser rod excitation module according to claim 12, further comprising a semiconductor laser light diffusing means disposed between said semiconductor laser light guiding means and said solid-state laser rod, for diffusing the laser light guided by said semiconductor laser light guiding means.

16. The solid-state laser rod excitation module according to claim 15, wherein said semiconductor laser light diffusing means is made of a transparent optical material whose surface is ground or rough like a ground glass.

17. The solid-state laser rod excitation module according to claim 15, wherein said semiconductor laser light diffusing means is made of a transparent foaming glass material including bubbles therein.

18. The solid-state laser rod excitation module according to claim 16, wherein said semiconductor laser light diffusing means is formed on said cooling sleeve.

19. The solid-state laser rod excitation module according to claim 16, wherein said semiconductor laser light diffusing means is made of sapphire whose surface is ground or rough like a ground glass.

20. A semiconductor laser light emitting apparatus comprising:
a semiconductor laser provided with at least one bar-shaped, or rectangular, component including a plurality of laser-light-emitting portions aligned and integrated in a direction of a slow axis of said semiconductor laser;
a semiconductor laser light refracting means for refracting all rays or some rays of the laser light emitted out of said semiconductor laser only with respect to the direction of the slow axis of said semiconductor laser; and
a semiconductor laser light focusing means for focusing refracted laser light emitted from said semiconductor laser light refracting means only with respect to a direction of a fast axis of said semiconductor laser,
wherein said semiconductor laser light refracting means is a roof prism having a ridgeline that is parallel to the fast axis of said semiconductor laser, said roof prism being placed so that one face thereof opposite to said ridgeline is substantially perpendicular to a direction in which the laser light emitted out of said semiconductor laser travels.

21. The semiconductor laser light emitting apparatus according to claim 20, wherein said semiconductor laser has only one bar-shaped component including a plurality of laser-light-emitting portions aligned and integrated in the direction of the slow axis of said semiconductor laser.

22. The semiconductor laser light emitting apparatus according to claim 20, wherein said semiconductor laser has a plurality of bar-shaped components that are stacked in the direction of the fast axis of said semiconductor laser, each of said plurality of bar-shaped components including a plurality of laser-light-emitting portions aligned and integrated in the direction of the slow axis of said semiconductor laser.

23. A semiconductor laser light emitting apparatus comprising:
a semiconductor laser provided with at least one bar-shaped, or rectangular, component including a plurality of laser-light-emitting portions aligned and integrated in a direction of a slow axis of said semiconductor laser;

a semiconductor laser light refracting means for refracting all rays or some rays of the laser light emitted out of said semiconductor laser only with respect to the direction of the slow axis of said semiconductor laser; and a semiconductor laser light focusing means for focusing refracted laser light emitted from said semiconductor laser light refracting means only with respect to a direction of a fast axis of said semiconductor laser, wherein said semiconductor laser light refracting means is a quadrangular prism having a trapezoidal cross section, whose two parallel lateral faces are substantially perpendicular to a direction in which the laser light emitted out of said semiconductor laser travels.

24. The semiconductor laser light emitting apparatus according to claim 23, wherein said semiconductor laser has only one bar-shaped component including a plurality of laser-light-emitting portions aligned and integrated in the direction of the slow axis of said semiconductor laser.

25. The semiconductor laser light emitting apparatus according to claim 23, wherein said semiconductor laser has a plurality of bar-shaped components that are stacked in the direction of the fast axis of said semiconductor laser, each of said plurality of bar-shaped components including a plurality of laser-light-emitting portions aligned and integrated in the direction of the slow axis of said semiconductor laser.

* * * * *